US009009971B2

(12) United States Patent
Campbell et al.

(10) Patent No.: US 9,009,971 B2
(45) Date of Patent: Apr. 21, 2015

(54) WICKING AND COUPLING ELEMENT(S) FACILITATING EVAPORATIVE COOLING OF COMPONENT(S)

(71) Applicant: International Business Machines Corporation, Armonk, NY (US)

(72) Inventors: Levi A. Campbell, Poughkeepsie, NY (US); Richard C. Chu, Hopewell Junction, NY (US); Milnes P. David, Fishkill, NY (US); Michael J. Ellsworth, Jr., Poughkeepsie, NY (US); Madhusudan K. Iyengar, Foster City, CA (US); Roger R. Schmidt, Poughkeepsie, NY (US); Robert E. Simons, Poughkeepsie, NY (US)

(73) Assignee: International Business Machines Corporation, Armonk, NY (US)

( * ) Notice: Subject to any disclaimer, the term of this patent is extended or adjusted under 35 U.S.C. 154(b) by 91 days.

(21) Appl. No.: 13/788,871

(22) Filed: Mar. 7, 2013

(65) Prior Publication Data
US 2014/0082942 A1 Mar. 27, 2014

Related U.S. Application Data

(63) Continuation of application No. 13/627,256, filed on Sep. 26, 2012.

(51) Int. Cl.
*B23P 15/26* (2006.01)
*H05K 7/20* (2006.01)

(52) U.S. Cl.
CPC ............... *B23P 15/26* (2013.01); *H05K 7/203* (2013.01); *H05K 7/20809* (2013.01)

(58) Field of Classification Search
USPC ............... 361/689, 690, 695–703; 29/890.03, 29/890.035, 890.07
See application file for complete search history.

(56) References Cited

U.S. PATENT DOCUMENTS 4,047,198 A 9/1977 Sekhon et al.
4,833,567 A * 5/1989 Saaski et al. .................. 361/700
(Continued)

FOREIGN PATENT DOCUMENTS

JP 2110296 A 4/1990

OTHER PUBLICATIONS

Chu, R.C., "Wick Evaporative Cooling System", IBM Technical Disclosure Bulletin, IPCOM000091562D, 3 pages (Mar. 1, 1968).
(Continued)

*Primary Examiner* — David Bryant
*Assistant Examiner* — Jason L Vaughan
(74) *Attorney, Agent, or Firm* — Steven Chiu, Esq.; Kevin P. Radigan, Esq.; Heslin Rothenberg Farley & Mesiti P.C.

(57) ABSTRACT

A method is provided for facilitating cooling of electronic components of an electronic system. The method includes: providing a housing at least partially surrounding and forming a compartment about the components, and providing an immersion-cooling fluid is disposed within the compartment, at least one component of the electronic system being at least partially non-immersed within the fluid in the compartment; providing a wicking film element physically coupled to a main surface of the at least one component and partially disposed within the fluid within the compartment; and securing, via a coupling element, the wicking film element in physical coupling to the main surface of the at least one component without the coupling element overlying the main surface of the component(s). As an enhancement, the wicking film element wraps over the component to physically couple to two opposite main sides of the component.

9 Claims, 19 Drawing Sheets

(56) References Cited

U.S. PATENT DOCUMENTS

| | | |
|---|---|---|
| 5,720,338 A | 2/1998 | Larson et al. |
| 6,055,157 A | 4/2000 | Bartilson |
| 6,388,882 B1 | 5/2002 | Hoover et al. |
| 6,443,222 B1 | 9/2002 | Yun et al. |
| 7,013,956 B2 | 3/2006 | Thayer et al. |
| 7,719,837 B2 | 5/2010 | Wu et al. |
| 7,761,802 B2 | 7/2010 | Shah et al. |
| 7,957,134 B2 * | 6/2011 | Farnsworth et al. ..... 361/679.54 |
| 7,961,465 B2 | 6/2011 | Goldrian et al. |
| 8,059,405 B2 | 11/2011 | Campbell et al. |
| 8,176,972 B2 | 5/2012 | Mok |
| 2002/0179284 A1 | 12/2002 | Joshi et al. |
| 2003/0056940 A1 | 3/2003 | Chu et al. |
| 2005/0168947 A1 * | 8/2005 | Mok et al. ..................... 361/698 |
| 2007/0095507 A1 | 5/2007 | Henderson et al. |
| 2010/0018678 A1 | 1/2010 | Siu |
| 2010/0328890 A1 | 12/2010 | Campbell et al. |
| 2012/0170221 A1 | 7/2012 | Mok |
| 2014/0085822 A1 * | 3/2014 | Campbell et al. ............. 361/700 |

OTHER PUBLICATIONS

Oshman et al., "The Development of Polymer-Based Flat Heat Pipes", Journal of Microelectromechanical Systems, vol. 20, No. 2, pp. 410-417 (Apr. 2011).

Campbell et al., "Wicking and Coupling Element(s) Facilitating Evaporative Cooling of Component(s)", U.S. Appl. No. 13/627,256, filed Sep. 26, 2012.

Campbell et al., Office Action for U.S. Appl. No. 13/627,256, filed Sep. 26, 2012 (US Patent Publication No. 2014/0085822 A1), dated Nov. 20, 2014 (10 pages).

* cited by examiner

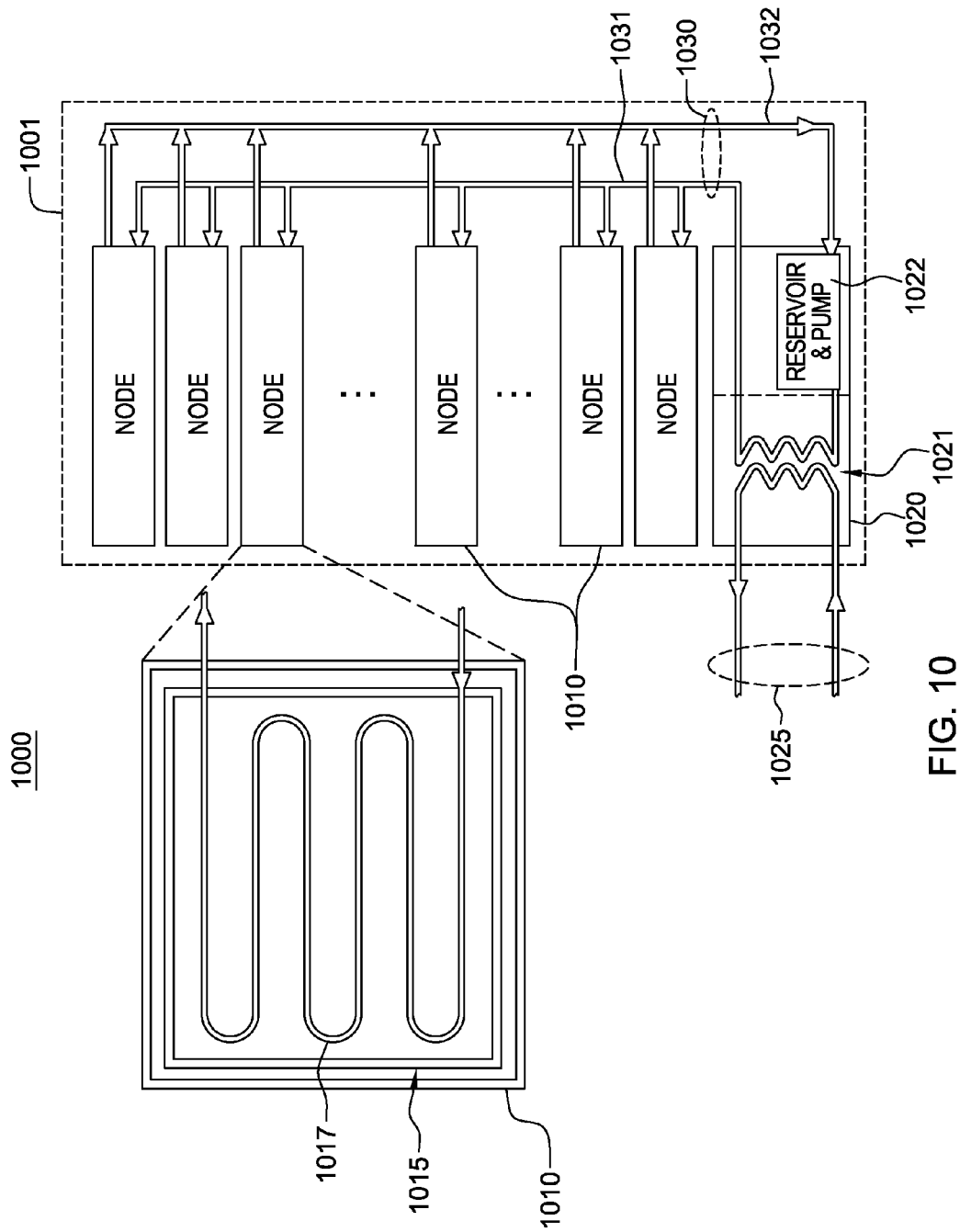

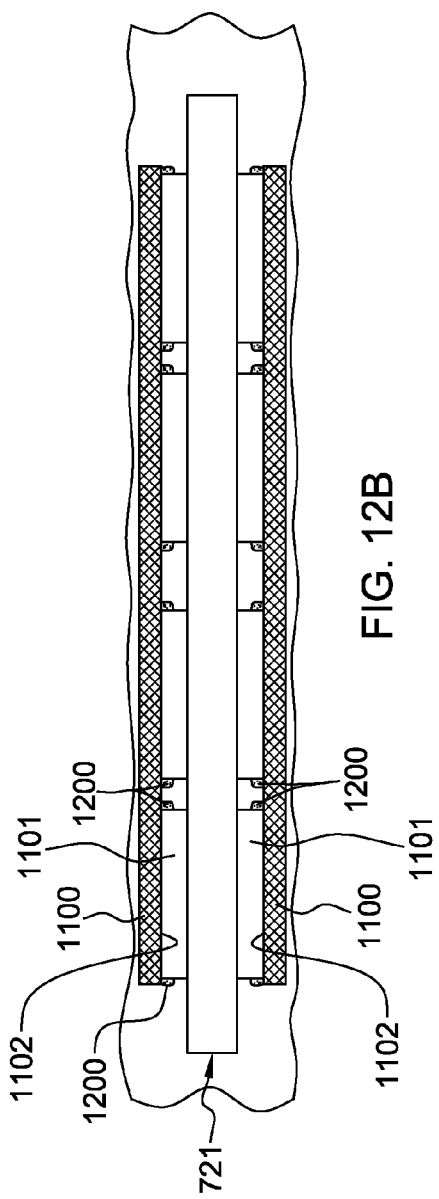
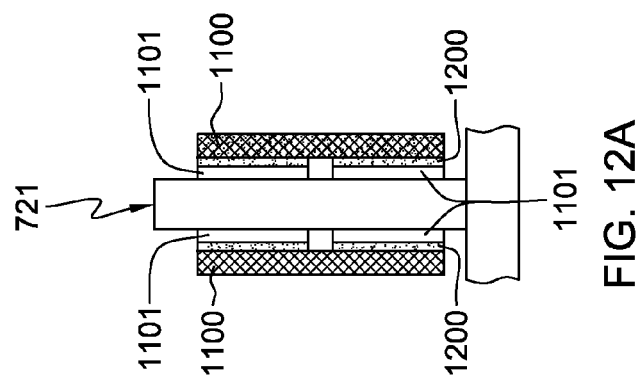

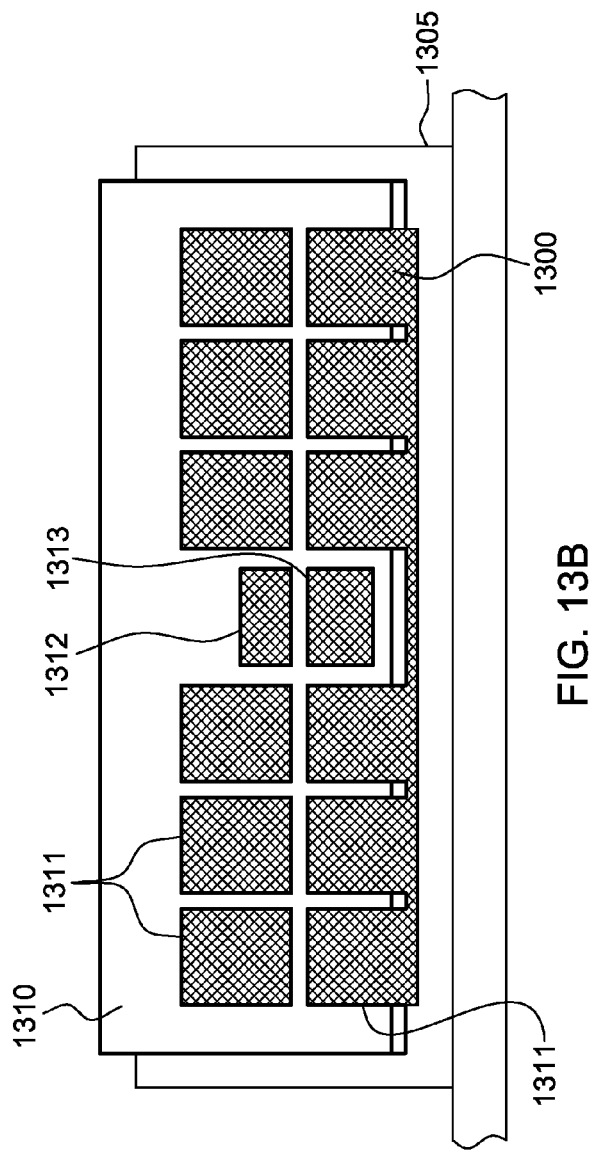
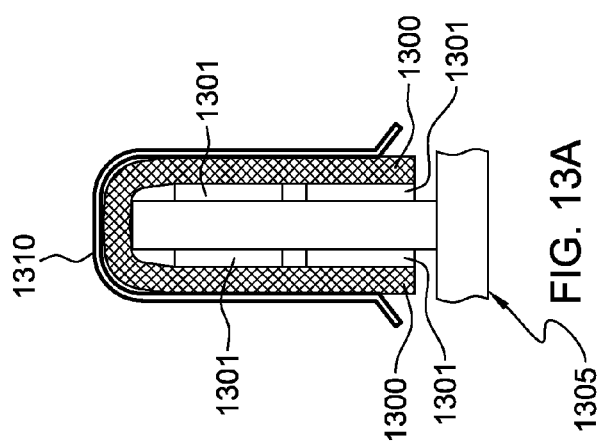
FIG. 13B
FIG. 13A

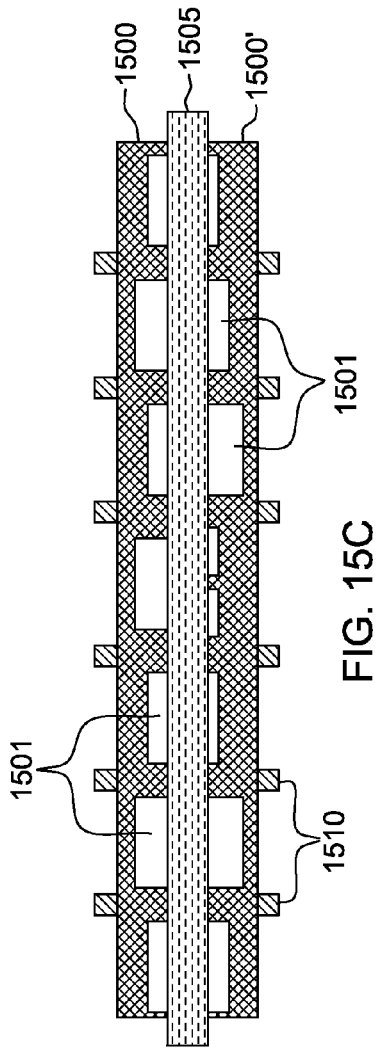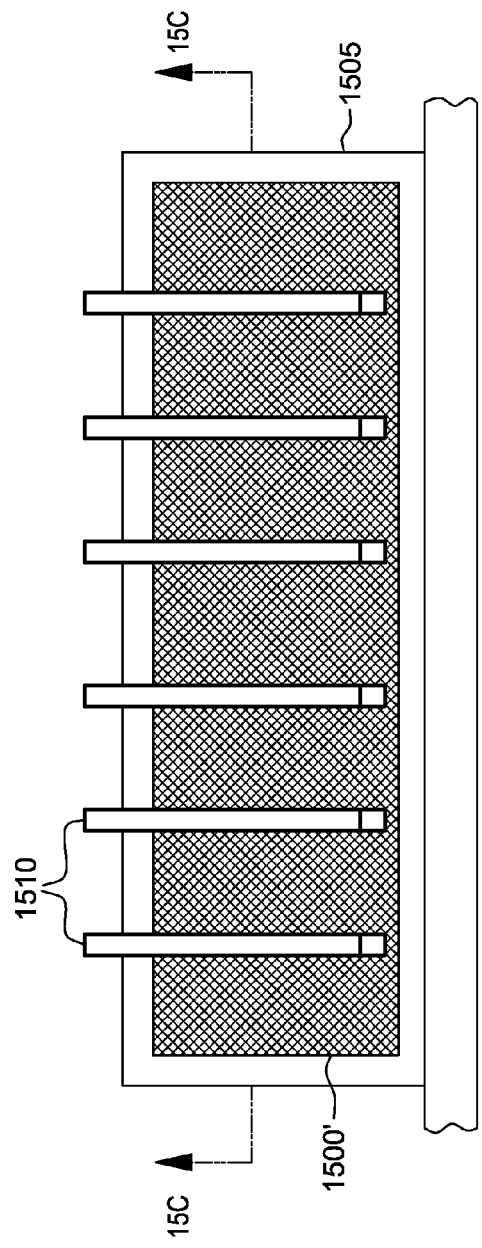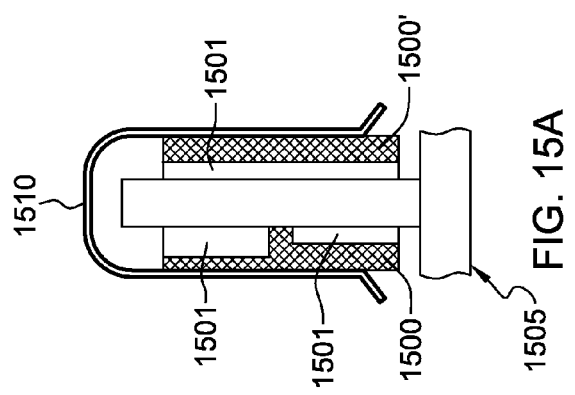

WICKING AND COUPLING ELEMENT(S) FACILITATING EVAPORATIVE COOLING OF COMPONENT(S)

CROSS-REFERENCE TO RELATED APPLICATION

This application is a continuation of U.S. Ser. No. 13/627,256, filed Sep. 26, 2012, and entitled "Wicking and Coupling Element(s) Facilitating Evaporative Cooling of Component(s)", and which is hereby incorporated herein by reference in its entirety.

BACKGROUND

The power dissipation of integrated circuit chips, and the modules containing the chips, continues to increase in order, for instance, to achieve continued increase in processor performance. This trend poses cooling challenges at the module and system levels.

In many large server applications, processors along with their associated electronics (e.g., memory, disk drives, power supplies, etc.) are packaged in removable drawer configurations stacked within an electronics rack or frame comprising information technology (IT) equipment. In other cases, the electronics may be in fixed locations within the rack or frame. Typically, the components are cooled by air moving in parallel airflow paths, usually front-to-back, impelled by one or more air moving devices (e.g., fans or blowers). In some cases it may be possible to handle increased power dissipation within a single drawer or subsystem by providing greater airflow, for example, through the use of a more powerful air moving device or by increasing the rotational speed (i.e., RPMs) of an existing air moving device. However, this approach is becoming problematic, particularly in the context of a computer center installation (i.e., data center).

The sensible heat load carried by the air exiting the rack is stressing the capability of the room air-conditioning to effectively handle the load. This is especially true for large installations with "server farms" or large banks of computer racks located close together. In such installations, liquid-cooling is an attractive technology to manage the higher heat fluxes. The liquid absorbs the heat dissipated by the components/modules in an efficient manner. Typically, the heat is ultimately transferred from the liquid to an outside environment, whether air or other liquid.

BRIEF SUMMARY

The shortcomings of the prior art are overcome and additional advantages are provided by, in one aspect, a method of facilitating cooling of an electronic system is provided. The method includes: providing a housing at least partially surrounding and forming a compartment about multiple components of the electronic system; providing a fluid disposed within the compartment, wherein an electronic component of the multiple components is at least partially non-immersed within the fluid; providing a wicking film element physically coupled to a main surface of the electronic component and partially disposed within the fluid disposed within the compartment; and securing, via a coupling element, the wicking film element in physical coupling with the main surface of the component without the coupling element overlying the main surface of the component.

Additional features and advantages are realized through the techniques of the present invention. Other embodiments and aspects of the invention are described in detail herein and are considered a part of the claimed invention.

BRIEF DESCRIPTION OF THE SEVERAL VIEWS OF THE DRAWINGS

One or more aspects of the present invention are particularly pointed out and distinctly claimed as examples in the claims at the conclusion of the specification. The foregoing and other objects, features, and advantages of the invention are apparent from the following detailed description taken in conjunction with the accompanying drawings in which:

FIG. 10 is an elevational view of one embodiment of a liquid-cooled electronics rack with partial immersion-cooling of electronic systems thereof, in accordance with one or more aspects of the present invention;

FIG. 12A is an end elevational view of one embodiment of a component comprising a component board and multiple chips disposed on opposite sides of the component board, with wicking film elements affixed to the chips on the component board, in accordance with one or more aspects of the present invention;

FIG. 12B is a top plan view of the structure of FIG. 12A, in accordance with one or more aspects of the present invention;

FIG. 13A is an end elevational depiction of another embodiment of a component comprising a component board with multiple chips disposed on opposite sides thereof and a wicking film element wrapped over the component board and chips, and held in place via one embodiment of a coupling element, in accordance with one or more aspects of the present invention;

FIG. 13B is a side elevational view of the structure of FIG. 13A, in accordance with one or more aspects of the present invention;

FIG. 15A is an end elevational depiction of another embodiment of a component comprising a component board with multiple chips disposed on opposite sides thereof and a first, shaped wicking film element physically coupled to a first side thereof and a second, shaped wicking film element physically coupled to a second side thereof, and maintained in position via multiple coupling elements, in accordance with one or more aspects of the present invention;

FIG. 15B is a side elevational view of the structure of FIG. 15A, in accordance with one or more aspects of the present invention; and FIG. 15C is a cross-sectional view of the structure of FIGS. 15A & 15B, taken along line 15C-15C in FIG. 15B, and illustrating first and second shaped, wicking film elements differently configured to accommodate differently-sized and spaced chips on the opposite main sides of the component board, in accordance with one or more aspects of the present invention.

DETAILED DESCRIPTION

Figure 1:
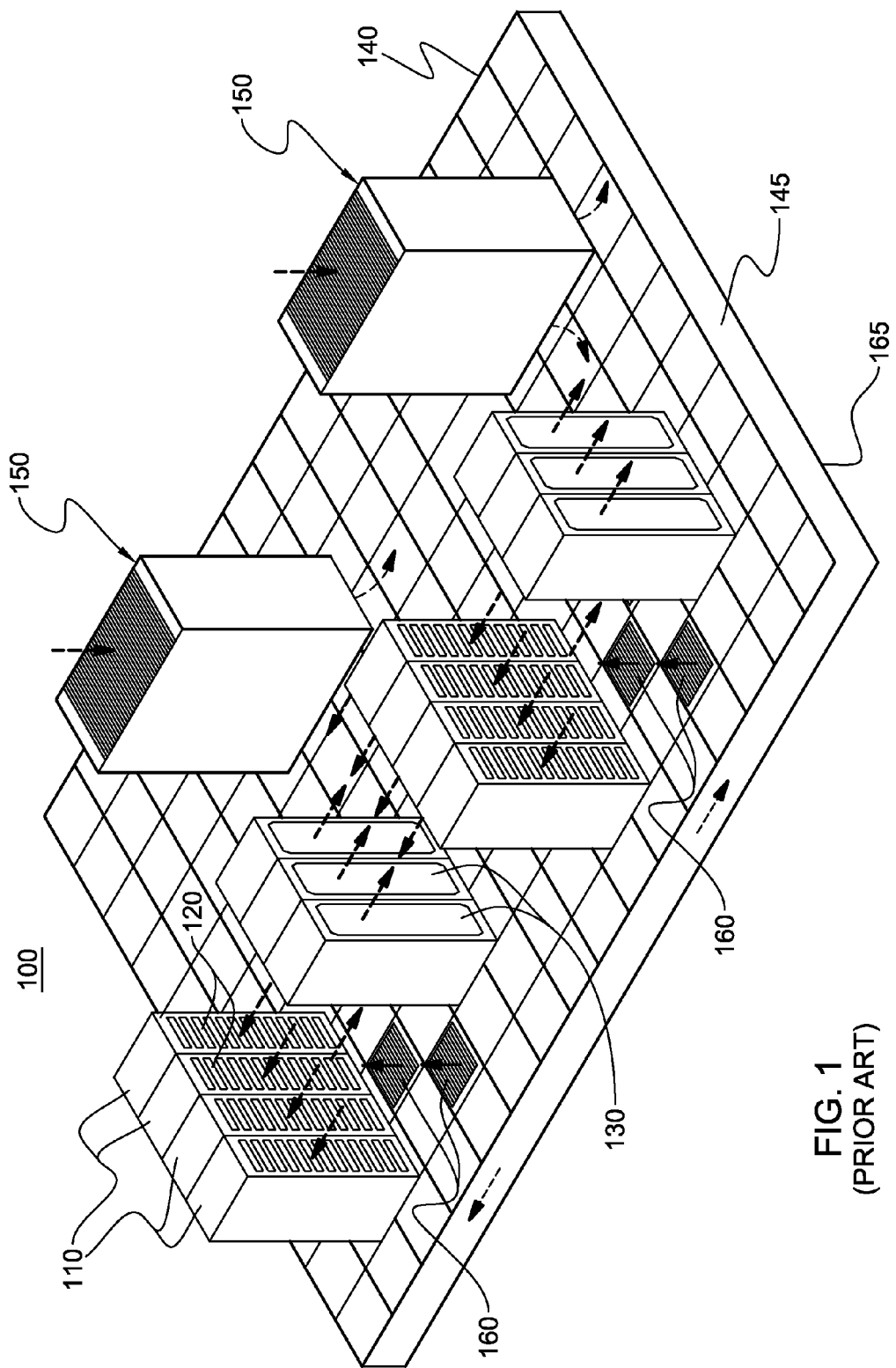
FIG. 1 depicts one embodiment of a conventional raised floor layout of an air-cooled computer installation.

As used herein, the terms "electronics rack", "rack-mounted electronic equipment", and "rack unit" are used interchangeably, and unless otherwise specified include any housing, frame, rack, compartment, blade server system, etc., having one or more heat-generating components of a computer system, electronic system, or information technology equipment, and may be, for example, a stand alone computer processor having high-, mid- or low-end processing capability. In one embodiment, an electronics rack may comprise a portion of an electronic system, a single electronic system, or multiple electronic systems, for example, in one or more sub-housings, blades, books, drawers, nodes, compartments, etc., having one or more heat-generating electronic components disposed therein. An electronic system(s) within an electronics rack may be movable or fixed, relative to the electronics rack, with rack-mounted electronic drawers and blades of a blade center system being two examples of electronic systems (or subsystems) of an electronics rack to be cooled.

"Electronic component" or "component" refers to any heat generating component of, for example, a computer system or other electronics unit requiring cooling. By way of example, an electronic component may comprise one or more integrated circuit dies and/or other electronic devices to be cooled, including one or more processor dies, memory dies or memory support dies. As a further example, the electronic component may comprise one or more bare dies or one or more packaged dies disposed on a common carrier. Further, unless otherwise specified herein, the terms "liquid-cooled cold plate", "liquid-cooled base plate", or "liquid-cooled structure" each refer to any conventional thermally conductive structure having a plurality of channels or passageways formed therein for flowing of liquid-coolant therethrough.

As used herein, a "liquid-to-liquid heat exchanger" may comprise, for example, two or more coolant flow paths, formed of thermally conductive tubing (such as copper or other tubing) in thermal or mechanical contact with each other. Size, configuration and construction of the liquid-to-liquid heat exchanger can vary without departing from the scope of the invention disclosed herein. Further, "data center" refers to a computer installation containing one or more electronics racks to be cooled. As a specific example, a data center may include one or more rows of rack-mounted computing units, such as server units.

One example of facility coolant and system coolant is water. However, the concepts disclosed herein are readily adapted to use with other types of coolant on the facility side and/or on the system side. For example, one or more of these coolants may comprise a brine, a dielectric liquid, a fluorocarbon liquid, a liquid metal, or other similar coolant, or a refrigerant, while still maintaining the advantages and unique features of the present invention.

Reference is made below to the drawings, which are not drawn to scale for ease of understanding of the various aspects of the present invention, wherein the same reference numbers used throughout different figures designate the same or similar components.

As shown in FIG. 1, in a raised floor layout of an air-cooled data center 100 typical in the prior art, multiple electronics racks 110 are disposed in one or more rows. A computer installation such as depicted in FIG. 1 may house several hundred, or even several thousand microprocessors. In the arrangement of FIG. 1, chilled air enters the computer room via floor vents from a supply air plenum 145 defined between the raised floor 140 and a base or sub-floor 165 of the room. Cooled air is taken in through louvered covers at air inlet sides 120 of the electronics racks and expelled through the backs, i.e., air outlet sides 130, of the electronics racks. Each electronics rack 110 may have one or more air-moving devices (e.g., fans or blowers) to provide forced inlet-to-outlet air flow to cool the electronic components within the drawer(s) of the rack. The supply air plenum 145 provides conditioned and cooled air to the air-inlet sides of the electronics racks via perforated floor tiles 160 disposed in a "cold" aisle of the computer installation. The conditioned and cooled air is supplied to plenum 145 by one or more air conditioning units 150, also disposed within data center 100. Room air is taken into each air conditioning unit 150 near an upper portion thereof. This room air may comprise (in part) exhausted air from the "hot" aisles of the computer installation defined by opposing air outlet sides 130 of the electronics racks 110.

Figure 2:
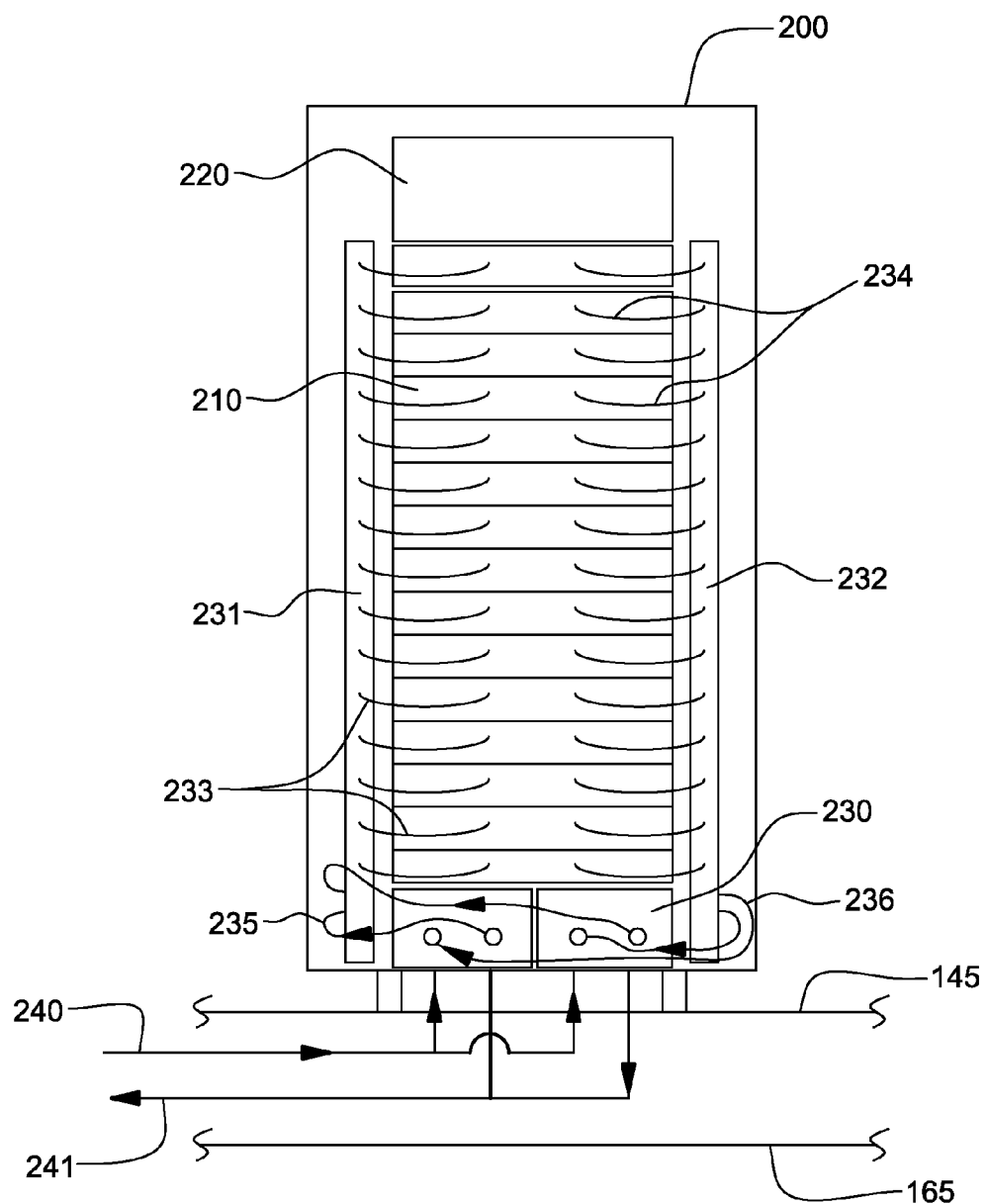
FIG. 2 is a front elevational view of one embodiment of a liquid-cooled electronics rack comprising multiple electronic systems to be cooled via a cooling apparatus, in accordance with one or more aspects of the present invention.

FIG. 2 depicts one embodiment of a liquid-cooled electronics rack 200 comprising a cooling apparatus. In one embodiment, liquid-cooled electronics rack 200 comprises a plurality of electronic systems 210, which may be processor or server nodes (in one embodiment). A bulk power assembly 220 is disposed at an upper portion of liquid-cooled electronics rack 200, and two modular cooling units (MCUs) 230 are positioned in a lower portion of the liquid-cooled electronics rack for providing system coolant to the electronic systems. In the embodiments described herein, the system coolant is assumed to be water or an aqueous-based solution, by way of example only.

In addition to MCUs 230, the cooling apparatus depicted includes a system coolant supply manifold 231, a system coolant return manifold 232, and manifold-to-node fluid connect hoses 233 coupling system coolant supply manifold 231 to electronic subsystems 210 (for example, to cold plates or liquid-cooled vapor condensers (see FIGS. 6A-9B) disposed within the systems) and node-to-manifold fluid connect hoses 234 coupling the individual electronic systems 210 to system coolant return manifold 232. Each MCU 230 is in fluid communication with system coolant supply manifold 231 via a respective system coolant supply hose 235, and each MCU 230 is in fluid communication with system coolant return manifold 232 via a respective system coolant return hose 236.

Heat load of the electronic systems 210 is transferred from the system coolant to cooler facility coolant within the MCUs 230 provided via facility coolant supply line 240 and facility coolant return line 241 disposed, in the illustrated embodiment, in the space between raised floor 145 and base floor 165.

Figure 3:
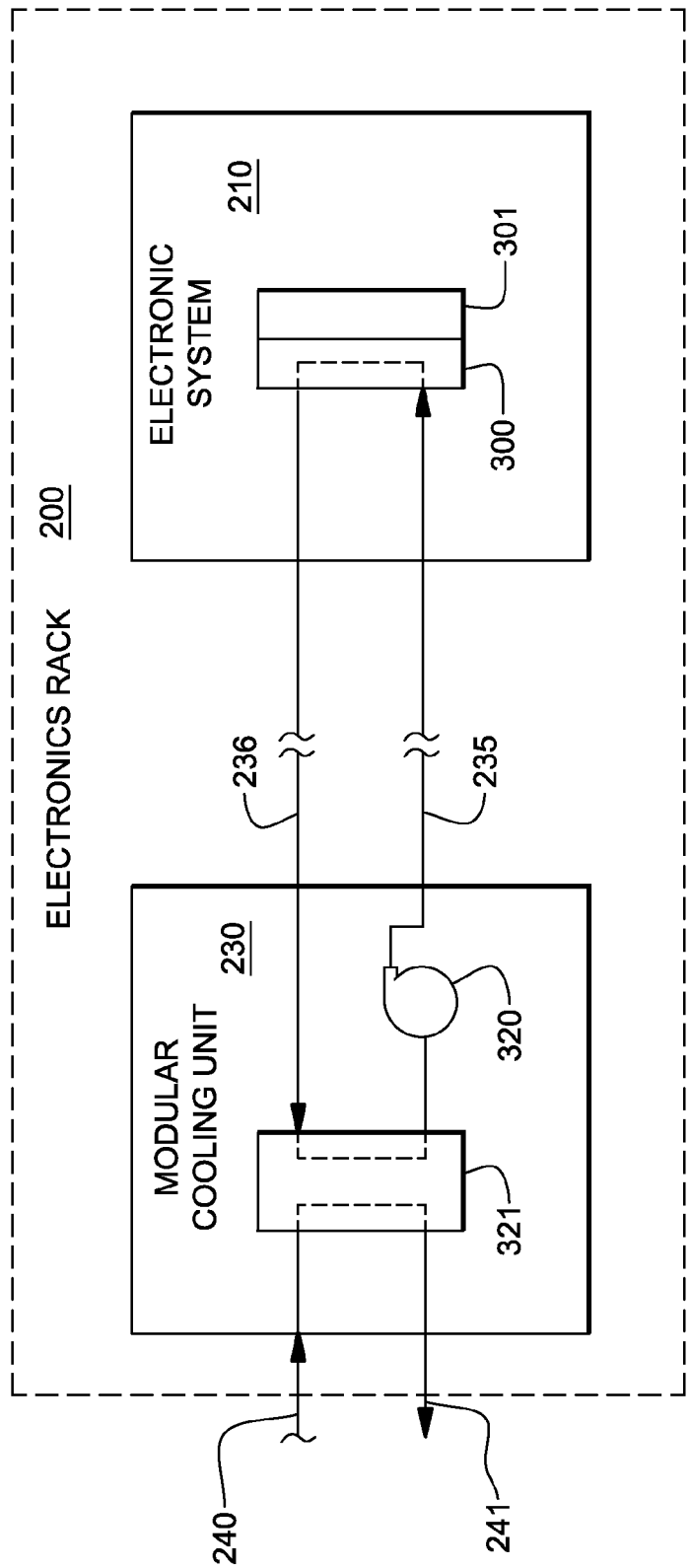
FIG. 3 is a schematic of an electronic system of an electronics rack and one approach to liquid-cooling of an electronic component with the electronic system, wherein the electronic component is indirectly liquid-cooled by system coolant provided by one or more modular cooling units disposed within the electronics rack, in accordance with one or more aspects of the present invention.

FIG. 3 schematically illustrates one cooling approach using the cooling apparatus of FIG. 2, wherein a liquid-cooled cold plate 300 is shown coupled to an electronic component 301 of an electronic system 210 within the liquid-cooled electronics rack 200. Heat is removed from electronic component 301 via system coolant circulating via pump 320 through liquid-cooled cold plate 300 within the system coolant loop defined, in part, by liquid-to-liquid heat exchanger 321 of modular cooling unit 230, hoses 235, 236 and cold plate 300. The system coolant loop and modular cooling unit are designed to provide coolant of a controlled temperature and pressure, as well as controlled chemistry and cleanliness to the electronic systems. Furthermore, the system coolant is physically separate from the less controlled facility coolant in lines 240, 241, to which heat is ultimately transferred.

Figure 4:
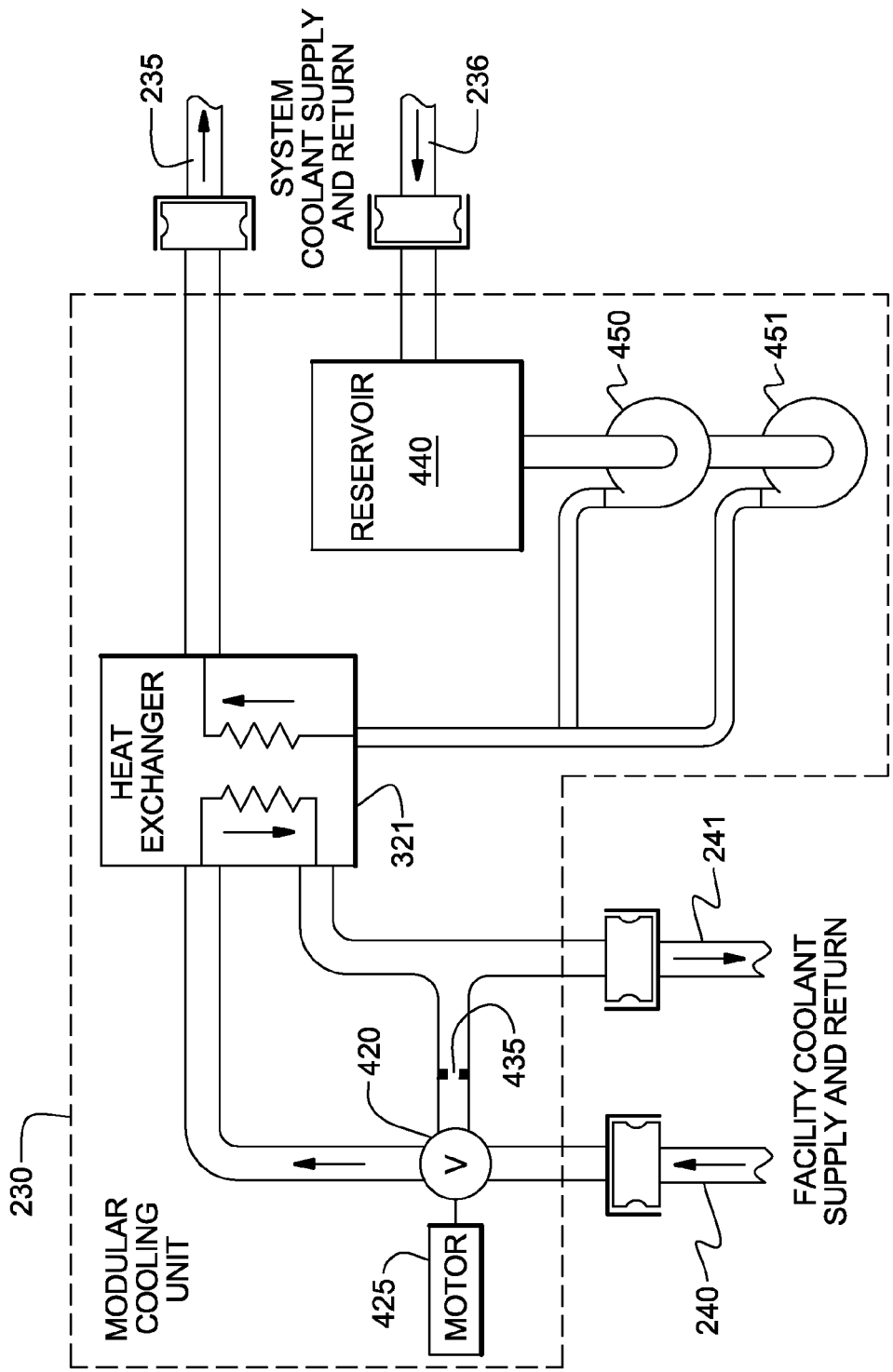
FIG. 4 is a schematic of one embodiment of a modular cooling unit for a liquid-cooled electronics rack such as illustrated in FIG. 2, in accordance with one or more aspects of the present invention.

FIG. 4 depicts one detailed embodiment of a modular cooling unit 230. As shown in FIG. 4, modular cooling unit 230 includes a facility coolant loop, wherein building chilled, facility coolant is provided (via lines 240, 241) and passed through a control valve 420 driven by a motor 425. Valve 420 determines an amount of facility coolant to be passed through heat exchanger 321, with a portion of the facility coolant possibly being returned directly via a bypass orifice 435. The modular cooling unit further includes a system coolant loop with a reservoir tank 440 from which system coolant is pumped, either by pump 450 or pump 451, into liquid-to-liquid heat exchanger 321 for conditioning and output thereof, as cooled system coolant to the electronics rack to be cooled. Each modular cooling unit is coupled to the system supply manifold and system return manifold of the liquid-cooled electronics rack via the system coolant supply hose 235 and system coolant return hose 236, respectively.

Figure 5:
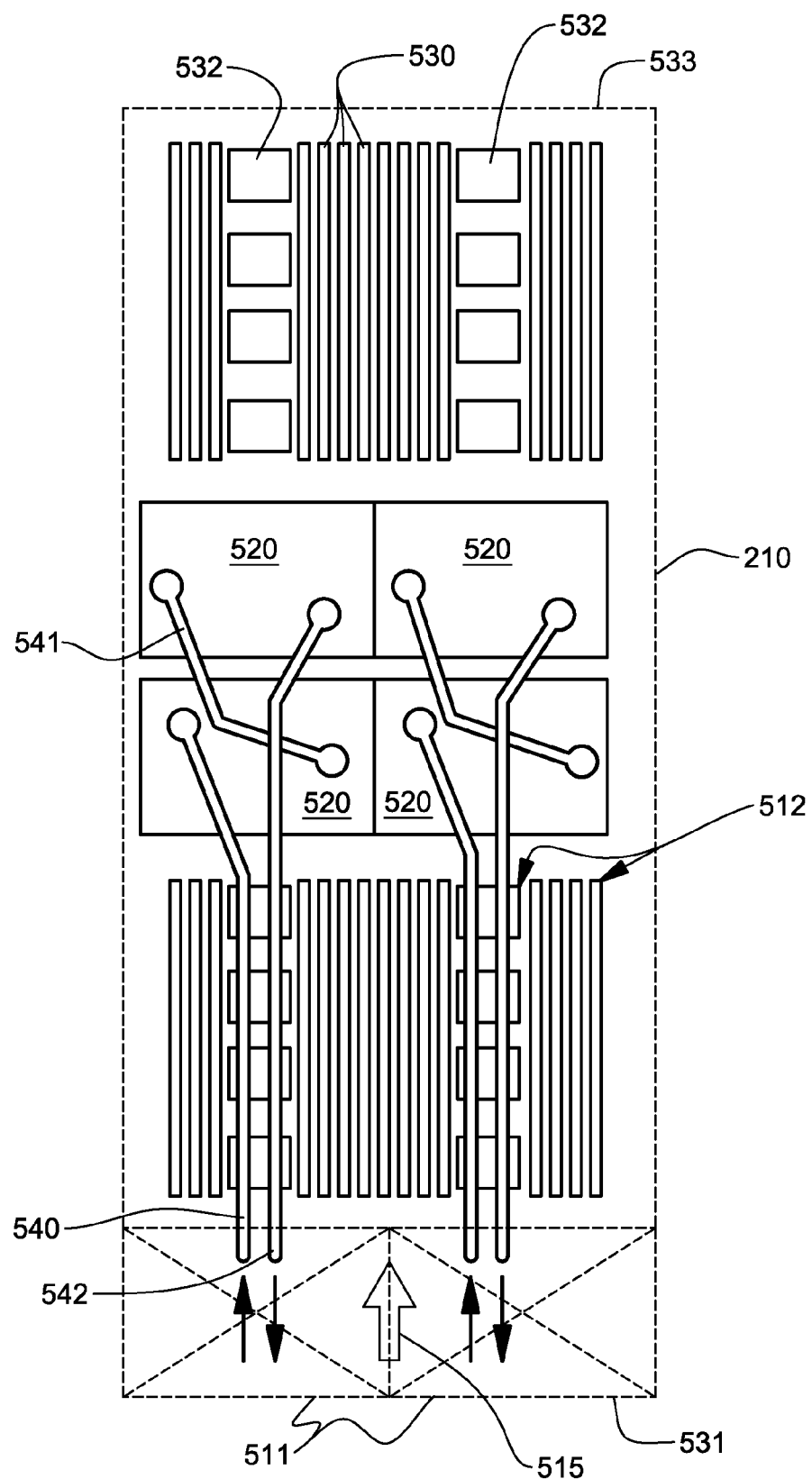
FIG. 5 is a plan view of one embodiment of an electronic system layout illustrating an air and liquid-cooling approach for cooling electronic components of the electronic system, in accordance with one or more aspects of the present invention.

FIG. 5 depicts another cooling approach, illustrating one embodiment of an electronic system 210 component layout wherein one or more air moving devices 511 provide forced air flow 515 in normal operating mode to cool multiple electronic components 512 within electronic system 210. Cool air is taken in through a front 531 and exhausted out a back 533 of the drawer. The multiple components to be cooled include multiple processor modules to which liquid-cooled cold plates 520 are coupled, as well as multiple arrays of memory modules 530 (e.g., dual in-line memory modules (DIMMs)) and multiple rows of memory support modules 532 (e.g., DIMM control modules) to which air-cooled heat sinks may be coupled. In the embodiment illustrated, memory modules 530 and the memory support modules 532 are partially arrayed near front 531 of electronic system 210, and partially arrayed near back 533 of electronic system 210. Also, in the embodiment of FIG. 5, memory modules 530 and the memory support modules 532 are cooled by air flow 515 across the electronics system.

The illustrated cooling apparatus further includes multiple coolant-carrying tubes connected to and in fluid communication with liquid-cooled cold plates 520. The coolant-carrying tubes comprise sets of coolant-carrying tubes, with each set including (for example) a coolant supply tube 540, a bridge tube 541 and a coolant return tube 542. In this example, each set of tubes provides liquid-coolant to a series-connected pair of cold plates 520 (coupled to a pair of processor modules). Coolant flows into a first cold plate of each pair via the coolant supply tube 540 and from the first cold plate to a second cold plate of the pair via bridge tube or line 541, which may or may not be thermally conductive. From the second cold plate of the pair, coolant is returned through the respective coolant return tube 542.

As computing demands continue to increase, heat dissipation requirements of electronic components, such as microprocessors and memory modules, are also rising. This has motivated the development of the application of single-phase, liquid-cooling solutions such as described above. Single-phase, liquid-cooling, however, has some issues. Sensible heating of the liquid as it flows along the cooling channels and across components connected in series results in a temperature gradient. To maintain a more uniform temperature across the heat-generating component, the temperature change in the liquid needs to be minimized. This requires the liquid to be pumped at higher flow rates, consuming more pump power, and thus leading to a less efficient system. Further, it is becoming increasingly challenging to cool all the heat sources on a server or electronic system using pumped liquid, due to the density and number of components, such as controller chips, I/O components and memory modules. The small spaces and number of components to be cooled make liquid plumbing a complex design and fabrication problem and significantly raises the overall cost of the cooling solution.

Immersion-cooling is one possible solution to these issues. In immersion-cooling, components to be cooled are immersed in a dielectric fluid that dissipates heat through boiling. The vapor is then condensed by a secondary, rack-level working (or system) fluid using node or module-level, finned condensers, as explained below.

Direct immersion-cooling of electronic components of an electronic system of the rack unit using dielectric fluid (e.g., a liquid dielectric coolant) advantageously avoids forced air cooling and enables total liquid-cooling of the electronics rack within the data center. Although indirect liquid-cooling, such as described above in connection with FIGS. 3 and 5, has certain advantages due to the low cost and wide availability of water as a coolant, as well as its superior thermal and hydraulic properties, where possible and viable, the use of dielectric fluid immersion-cooling may offer several unique benefits.

For example, the use of a dielectric fluid that condenses at a temperature above typical outdoor ambient air temperature would enable data center cooling architectures which do not require energy intensive refrigeration chillers. Yet other practical advantages, such as the ability to ship a coolant filled electronic subsystem, may offer benefit over water-cooled approaches such as depicted in FIGS. 3 & 5, which require shipping dry and the use of a fill and drain protocol to insure against freeze damage during transport. Also, the use of liquid immersion-cooling may, in certain cases, allow for greater compaction of electronic components at the electronic subsystem level and/or electronic rack level since conductive cooling structures might be eliminated. Unlike corrosion sensitive water-cooled systems, chemically inert dielectric coolant (employed with an immersion-cooling approach such as described herein) would not mandate copper as the primary thermally conductive wetted metal. Lower cost and lower mass aluminum structures could replace copper structures wherever thermally viable, and the mixed wetted metal assemblies would not be vulnerable to galvanic corrosion, such as in the case of a water based cooling approach. For at least these potential benefits, dielectric fluid immersion-cooling of one or more electronic systems of an electronics rack may offer significant energy efficiency and higher performance cooling benefits, compared with currently available hybrid air and indirect water cooled systems.

In the examples discussed below, the dielectric fluid may comprise any one of a variety of commercially available dielectric coolants. For example, any of the Fluorinert™ or Novec™ fluids manufactured by 3M Corporation (e.g., FC-72, FC-86, HFE-7000, and HFE-7200) could be employed. Alternatively, a refrigerant such as R-134a or R-245fa may be employed if desired.

Figure 6A:
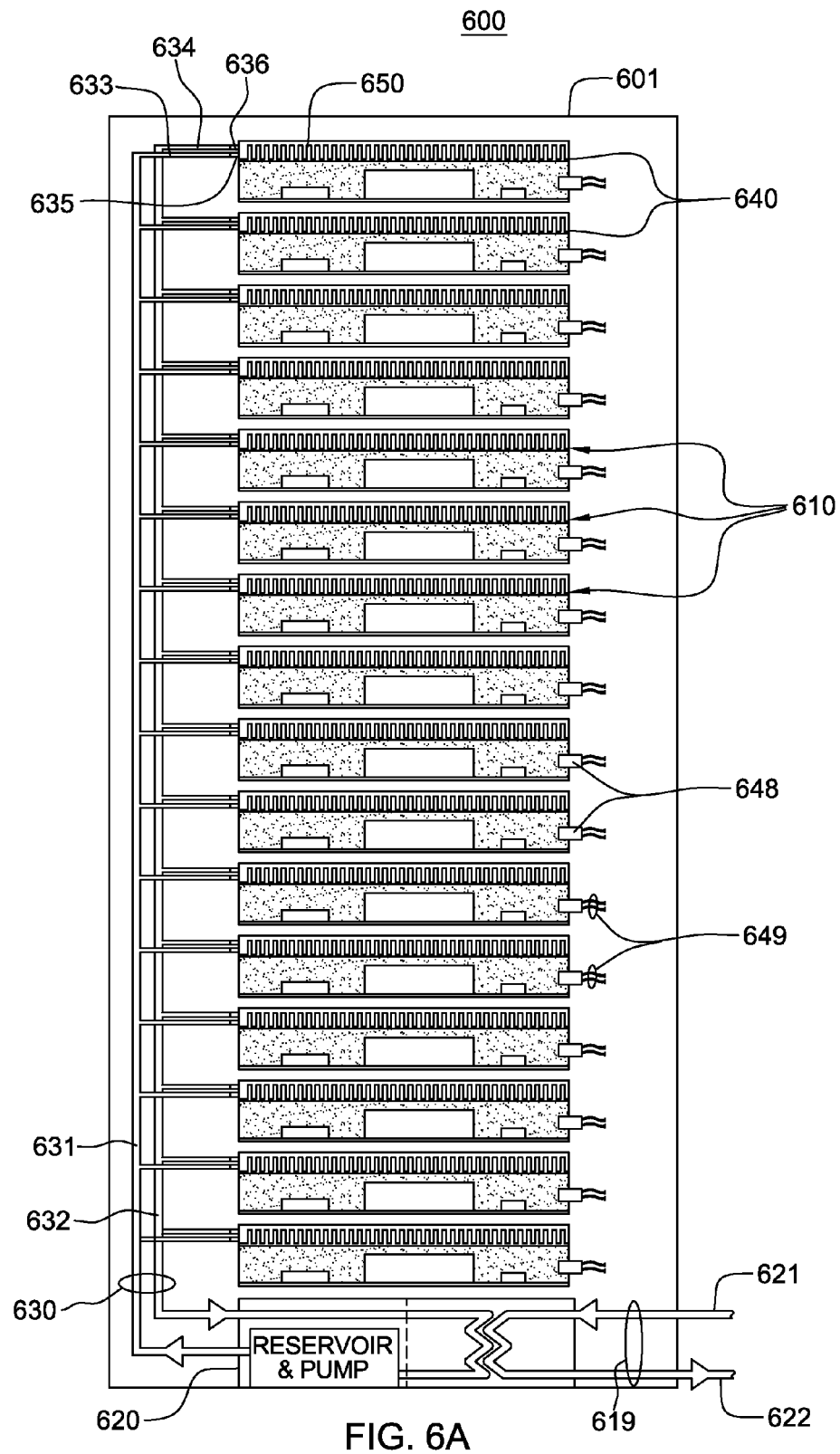
FIG. 6A is an elevational view of an alternate embodiment of a liquid-cooled electronics rack with immersion-cooling of electronic systems thereof, in accordance with one or more aspects of the present invention.

FIG. 6A is a schematic of one embodiment of a liquid-cooled electronics rack, generally denoted 600, employing immersion-cooling of electronic systems, in accordance with an aspect of the present invention. As shown, liquid-cooled electronics rack 600 includes an electronics rack 601 containing a plurality of electronic systems 610 disposed, in the illustrated embodiment, horizontally so as to be stacked within the rack. By way of example, each electronic system 610 may be a server unit of a rack-mounted plurality of server units. In addition, each electronic system includes multiple electronic components to be cooled, which in one embodiment, comprise multiple different types of electronic components having different heights and/or shapes within the electronic system.

The cooling apparatus is shown to include one or more modular cooling units (MCU) 620 disposed, by way of example, in a lower portion of electronics rack 601. Each modular cooling unit 620 may be similar to the modular cooling unit depicted in FIG. 4, and described above. The modular cooling unit includes, for example, a liquid-to-liquid heat exchanger for extracting heat from coolant flowing through a system coolant loop 630 of the cooling apparatus and dissipating heat within a facility coolant loop 619, comprising a facility coolant supply line 621 and a facility coolant return line 622. As one example, facility coolant supply and return lines 621, 622 couple modular cooling unit 620 to a data center facility coolant supply and return (not shown). Modular cooling unit 620 further includes an appropriately sized reservoir, pump and optional filter for moving liquid-coolant under pressure through system coolant loop 630. In one embodiment, system coolant loop 630 includes a coolant supply manifold 631 and a coolant return manifold 632, which are coupled to modular cooling unit 620 via, for example, flexible hoses. The flexible hoses allow the supply and return manifolds to be mounted within, for example, a door of the electronics rack hingedly mounted to the front or back of the electronics rack. In one example, coolant supply manifold 631 and coolant return manifold 632 each comprise an elongated rigid tube vertically mounted to the electronics rack 601 or to a door of the electronics rack.

In the embodiment illustrated, coolant supply manifold 631 and coolant return manifold 632 are in fluid communication with respective coolant inlets 635 and coolant outlets 636 of individual sealed housings 640 containing the electronic systems 610. Fluid communication between the manifolds and the sealed housings is established, for example, via appropriately sized, flexible hoses 633, 634. In one embodiment, each coolant inlet 635 and coolant outlet 636 of a sealed housing is coupled to a respective liquid-cooled vapor condenser 650 disposed within the sealed housing 640. Heat removed from the electronic system 610 via the respective liquid-cooled vapor condenser 650 is transferred from the system coolant via the coolant return manifold 632 and modular cooling unit 620 to facility coolant loop 619. In one example, coolant passing through system coolant loop 630, and hence, coolant passing through the respective liquid-cooled vapor condensers 650 is water.

Note that, in general, fluidic coupling between the electronic subsystems and coolant manifolds, as well as between the manifolds and the modular cooling unit(s) can be established using suitable hoses, hose barb fittings and quick disconnect couplers. In the example illustrated, the vertically-oriented coolant supply and return manifolds 631, 632 each include ports which facilitate fluid connection of the respective coolant inlets and outlets 635, 636 of the housings (containing the electronic subsystems) to the manifolds via the flexible hoses 633, 634. Respective quick connect couplings may be employed to couple the flexible hoses to the coolant inlets and coolant outlets of the sealed housings to allow for, for example, removal of a housing and electronic subsystem from the electronics rack. The quick connect couplings may be any one of various types of commercial available couplings, such as those available from Colder Products Co. of St. Paul, Minn., USA or Parker Hannifin of Cleveland, Ohio, USA.

One or more hermetically sealed electrical connectors 648 may also be provided in each sealed housing 640, for example, at a back surface thereof, for docking into a corresponding electrical plane (not shown) of the electronics rack in order to provide electrical and network connections 649 to the electronic system disposed within the sealed housing when the electronic system is operatively positioned within the sealed housing and the sealed housing is operatively positioned within the electronics rack.

Figure 6B:
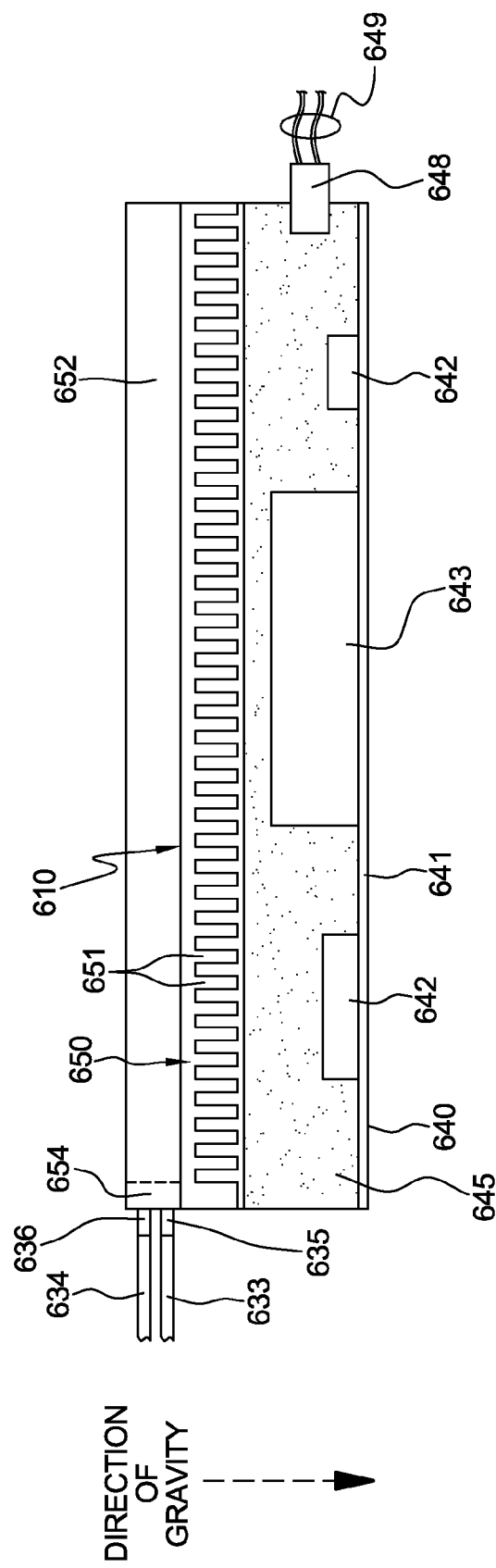
FIG. 6B is a cross-sectional elevational view of one immersion-cooled electronic system of the liquid-cooled electronics rack of FIG. 6A, in accordance with one or more aspects of the present invention.

As illustrated in FIG. 6B, electronic system 610 comprises a plurality of electronic components 642, 643 of different height and type on a substrate 641, and is shown within sealed housing 640 with the plurality of electronic components 642, 643 immersed within a dielectric fluid 645. Sealed housing 640 is configured to at least partially surround and form a sealed compartment about the electronic system with the plurality of electronic components 642, 643 disposed within the sealed compartment. In an operational state, dielectric fluid 645 pools in the liquid state at the bottom of the sealed compartment and is of sufficient volume to submerge the electronic components 642, 643. The electronic components 642, 643 dissipate varying amounts of power, which cause the dielectric fluid to boil, releasing dielectric fluid vapor, which rises to the upper portion of the sealed compartment of the housing.

The upper portion of sealed housing 640 is shown in FIG. 6B to include liquid-cooled vapor condenser 650. Liquid-cooled vapor condenser 650 is a thermally conductive structure which includes a liquid-cooled base plate 652, and a plurality of thermally conductive condenser fins 651 extending therefrom in the upper portion of the sealed compartment. A plenum structure 654 comprises part of liquid-cooled base plate 652, and facilitates passage of system coolant through one or more channels in the liquid-cooled base plate 652. In operation, the dielectric fluid vapor contacts the cool surfaces of the thermally conductive condenser fins and condenses back to liquid phase, dropping downwards towards the bottom of the sealed compartment.

System coolant supplied to the coolant inlet of the housing passes through the liquid-cooled base plate of the liquid-cooled vapor condenser and cools the solid material of the condenser such that condenser fin surfaces that are exposed within the sealed compartment to the dielectric fluid vapor (or the dielectric fluid itself) are well below saturation temperature of the vapor. Thus, vapor in contact with the cooler condenser fin surfaces will reject heat to these surfaces and condense back to liquid form. Based on operating conditions of the liquid-cooled vapor condenser 650, the condensed liquid may be close in temperature to the vapor temperature or could be sub-cooled to a much lower temperature.

Advantageously, in immersion-cooling, all of the components to be cooled are immersed in the dielectric fluid. The system fluid can tolerate a larger temperature rise, while maintaining component temperatures, thus allowing a lower flow rate, and higher inlet temperatures, improving energy efficiency of the resultant cooling apparatus. However, two-phase immersion-cooling enclosures may require a large volume of dielectric fluid to completely cover the variously configured components within the system, including (for example) dual in-line memory modules (DIMMs), graphics boards, solid state drives (SSDs), and processors with tall heat spreader fins attached. This need for a large amount of dielectric fluid increases both the weight and the cost of the cooling solution. Disclosed hereinbelow with reference to FIGS. 7A-10 are alternate embodiments of a cooling apparatus, wherein partial immersion-cooling is employed in combination with a condensate redirect structure, which preferentially redirects condensate drip onto selected, non-immersed electronic components or portions thereof of the electronic system. These non-immersed components may be taller electronic components that are only partially immersed, or may even be electronic components suspended within the electronic system such that they are completely non-immersed within the dielectric fluid. The cooling apparatuses and methods disclosed herein facilitate partial immersion-cooling of electronic components of an electronic system, and thereby advantageously reduce the amount of dielectric fluid required within the system compared with a full immersion-cooling approach described above in connection with FIGS. 6A-6B.

By way of example, the cooling apparatus includes a housing at least partially surrounding and forming a compartment about multiple electronic components to be cooled, and a fluid disposed within the compartment. A first electronic component of the multiple electronic components is at least partially non-immersed within the fluid, and a second electronic component of the multiple electronic components is at least partially non-immersed within the fluid, wherein the first and second electronic components are different types of electronic components with different configurations. The cooling apparatus further includes a vapor condenser comprising a vapor-condensing surface disposed at least partially in a vapor region of the compartment for condensing fluid vapor, and a condensate redirect structure disposed within the compartment at least partially between the vapor condenser and the first and second electronic components. The condensate redirect structure is differently configured over the first electronic component compared with over the second electronic component, and provides a different pattern of condensate drip over the first electronic component compared with over the second electronic component.

In certain embodiments, the condensate redirect structure of the cooling apparatus may comprise different patterns of condensate drip openings over the first electronic component compared with over the second electronic component, or the condensate redirect structure may comprise differently configured condensate drip openings over the first electronic component compared with over the second electronic component. The first electronic component may be a higher-heat-generating electronic component than the second electronic component, and in that case, the condensate redirect structure facilitates greater condensate drip over the first electronic component compared with over the second electronic component. Thus, the condensate redirect structure may include, for instance, different patterns of condensate drip openings over the first and second electronic components, or differently configured condensate drip openings over the first and second electronic components, with the different pattern of condensate drip over the first electronic component compared with over the second electronic component being correlated, at least in part, to the different configurations of the first electronic component and the second electronic component.

Figure 7A:
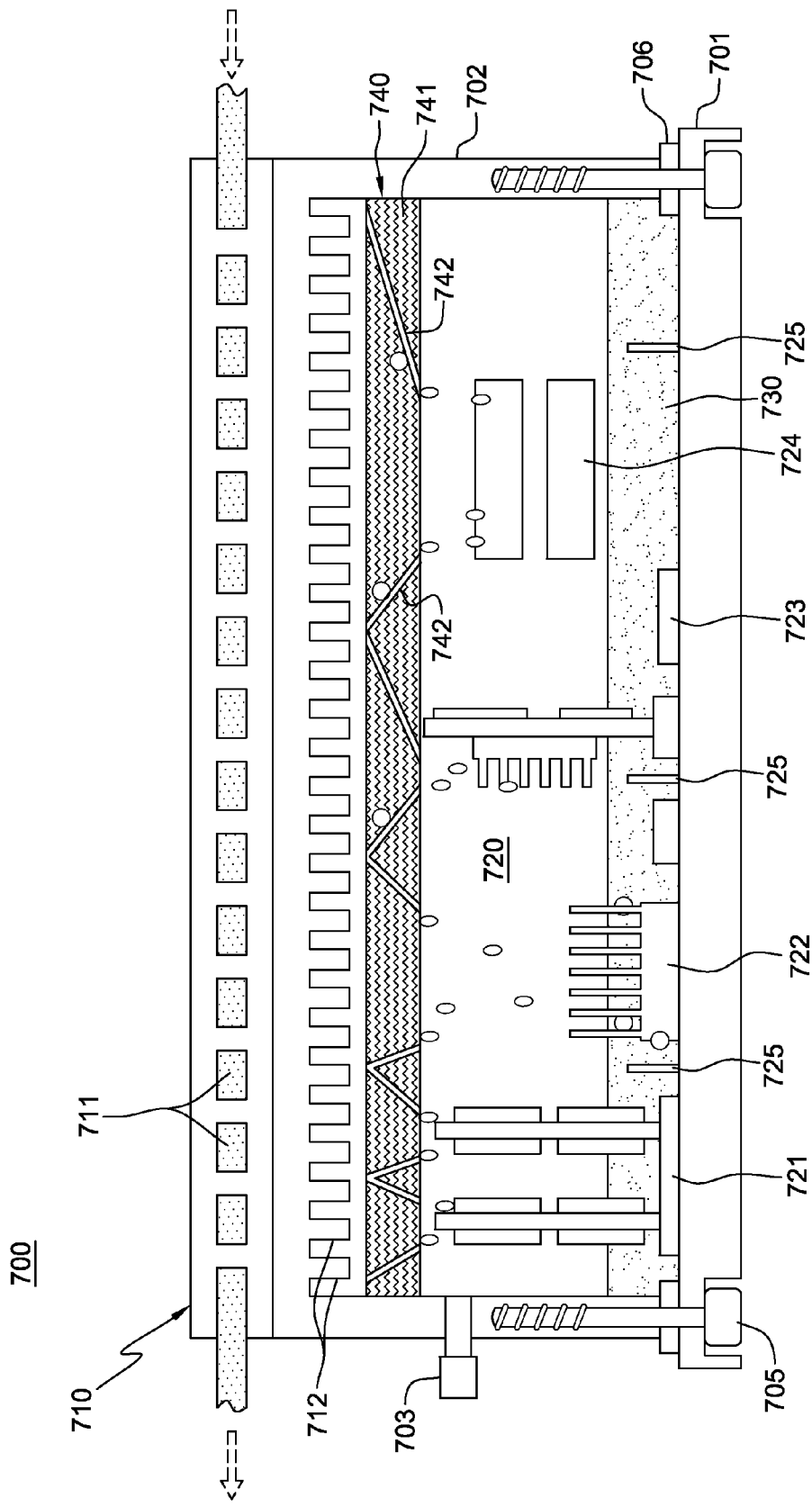
FIG. 7A is a cross-sectional elevational view of one embodiment of a partial immersion-cooled electronic system for, for example, a liquid-cooled electronics rack, in accordance with one or more aspects of the present invention.
Figure 7B:
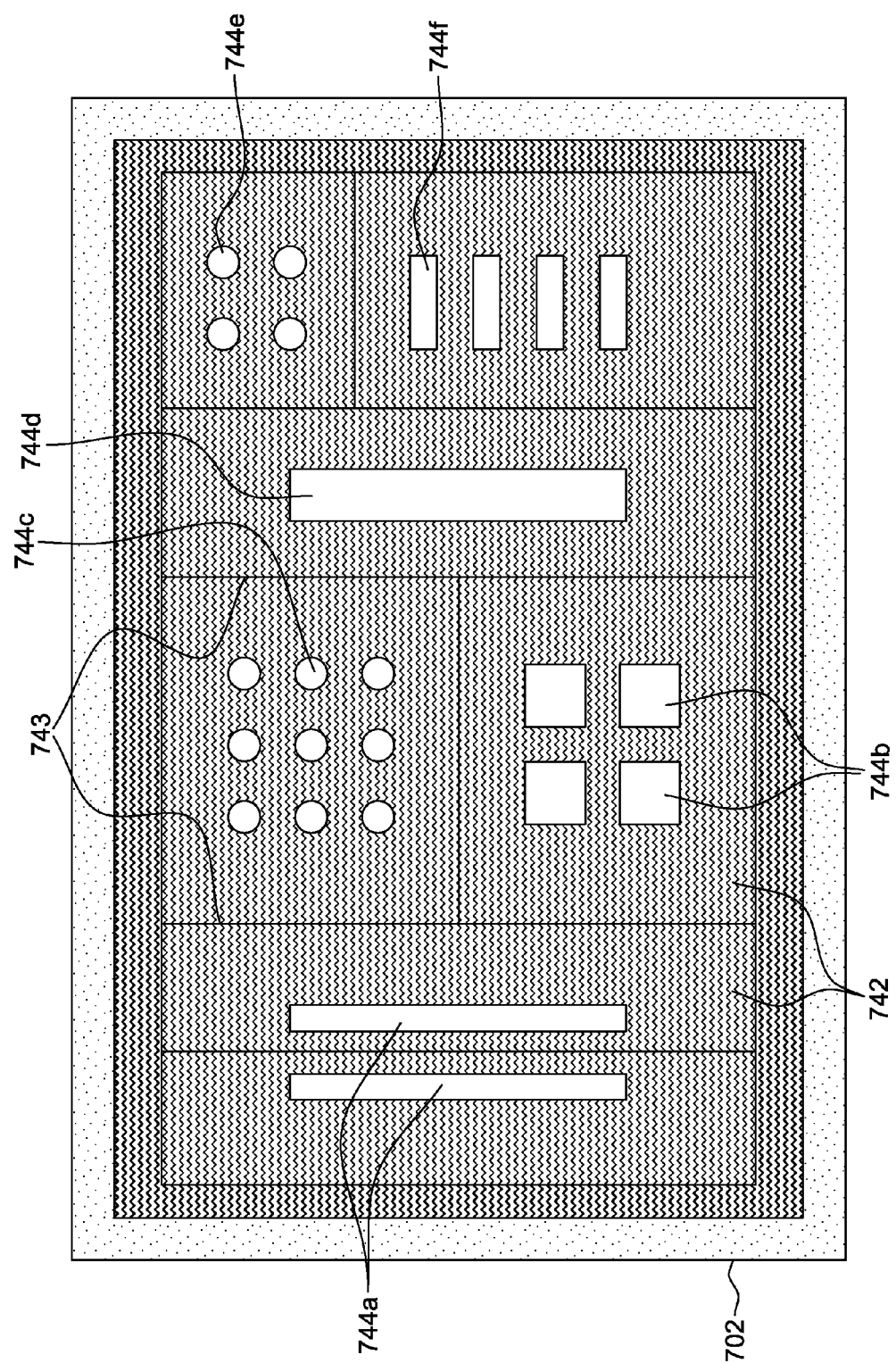
FIG. 7B is a plan view of one embodiment of a condensate redirect structure of the partial immersion-cooled electronic system of FIG. 7A, in accordance with one or more aspects of the present invention.

By way of detailed example, FIGS. 7A & 7B depict a first cooling apparatus embodiment wherein the condensate redirect structure comprises a vapor-permeable, liquid-phobic material with a plurality of condensate drip openings disposed in different, sloped regions of the structure. These condensate drip openings may be differently shaped openings that facilitate, at least in part, a desired pattern of condensate dripping onto differently configured electronic components to be cooled.

Figure 8A:
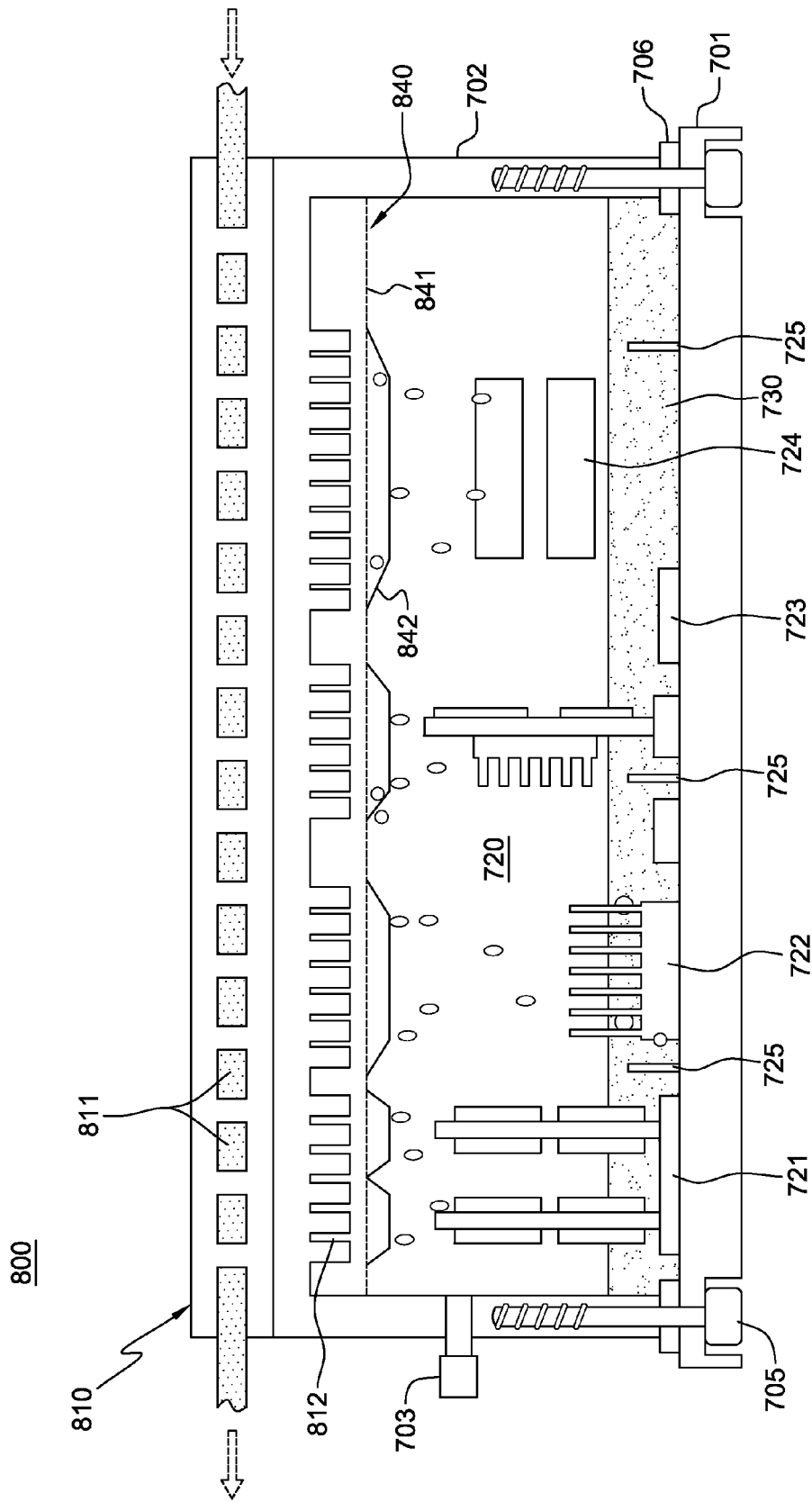
FIG. 8A is a cross-sectional elevational view of an alternate embodiment of a partial immersion-cooled electronic system for, for example, a liquid-cooled electronics rack, in accordance with one or more aspects of the present invention.
Figure 8B:
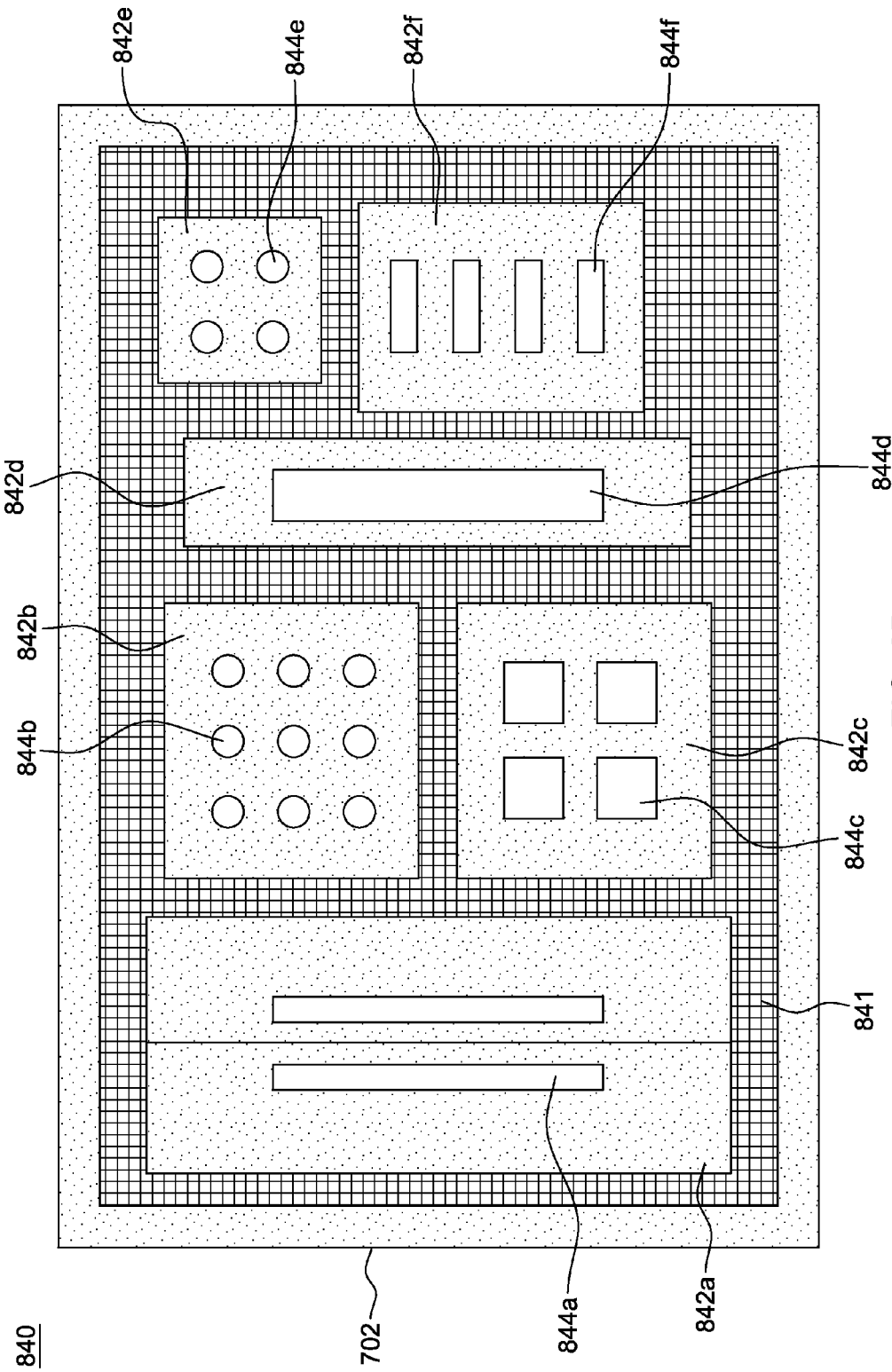
FIG. 8B is a plan view of one embodiment of a condensate redirect structure of the partial immersion-cooled electronic system of FIG. 8A, in accordance with one or more aspects of the present invention.

In an alternate embodiment, the condensate redirect structure of the cooling apparatus may comprise a mesh structure with multiple condensate drip pans supported by the mesh structure. One embodiment of this configuration is depicted in FIGS. 8A-8B. In this configuration, and by way of example, a first condensate drip pan of the multiple condensate drip pans is configured to provide a first pattern of condensate drip onto the first electronic component, and a second condensate drip pan of the multiple condensate drip pans is configured to provide a second pattern of condensate drip onto the second electronic component, wherein the first pattern of condensate drip and the second pattern of condensate drip are different patterns of condensate drip. Further, vapor condenser condensing surfaces may be physically and/or chemically modified to, for example, increase condensation and condensate drip over selected regions of the electronic system.

In another embodiment, the condensate redirect structure of the cooling apparatus may be suspended at an angle within the compartment to facilitate the flow of condensate drops along the suspended condensate redirect structure. In this embodiment, the suspended condensate redirect structure includes a drip pan with a plurality of condensate drip openings, wherein multiple condensate drip openings of the plurality of condensate drip openings are aligned over, for example, the first and second electronic components. In addition, in this embodiment, the vapor condenser may include one or more sloped, thermally conductive fins which facilitate movement of condensed coolant drops in a first direction for dripping onto the condensate redirect structure at a first side or other desired region thereof. In combination with this, the condensate redirect structure may be suspended at an angle to facilitate movement of the condensed coolant drops in a second direction along the condensate redirect structure, wherein the second direction is different from the first direction. In one embodiment, the second direction is opposite to the first direction.

Advantageously, the condensate redirect structure of the cooling apparatus is a shaped, porous structure disposed between the vapor condenser and the electronic components being cooled. The condensate drip structure facilitates collecting condensed coolant drops, and dripping the condensate preferentially over, for example, the at least partially non-immersed electronic components of the electronic system, which may include DIMMs, graphics and network cards, solid state drives, heat-spreader extended surfaces, etc. The condensed coolant drips onto these partially non-immersed electronic components, with most of the coolant making its way back into the pool of dielectric fluid at the lower region of the compartment, and with some of the condensate drip contacting the non-immersed portions of the electronic component evaporating directly, and thus cooling the heated, non-immersed electronic component, or portion thereof extending from the dielectric fluid. Thus, a smaller fill height of dielectric coolant is required, and less volume of dielectric coolant is needed in this partial immersion-cooling implementation. This reduction in coolant fluid helps to reduce the cost and weight of the immersion-cooling solution. In addition to this specific advantage, an immersion-cooling solution has several inherent advantages, including improved temperature uniformity across the various components, lower required flow rate of the system coolant, and potential for warm water-cooling. The latter advantage improves energy efficiency, and may enable the use of economizers.

FIG. 7A is a cross-sectional elevational view of one embodiment of a cooled electronic system, generally denoted 700, comprising a cooling apparatus in accordance with one or more aspects of the present invention. In one embodiment, the cooling apparatus may be configured to accommodate an electronic system (or node) of an electronics rack, such as described above in connection with FIGS. 6A & 6B. In such an embodiment, a rack-level inlet manifold and rack-level outlet manifold would facilitate distribution of system liquid coolant 711 through the liquid-cooled vapor condenser 710 of the cooling apparatuses associated with the electronic systems of the electronics rack (as described further below in relation to the example of rack unit of FIG. 10). Further, depending upon the implementation, there may be a single cooling apparatus for an electronic system cooling, for instance, substantially the entire electronic system or multiple such cooling apparatuses within the electronic system, for example, to separately cool different electronic components thereof.

As illustrated in FIG. 7A, liquid-cooled vapor condenser 710 includes (in this example) a plurality of thermally conductive fins 712, which comprise one or more vapor-condensing surfaces disposed at least partially in a vapor region of a compartment 720 defined by a housing 702 at least partially surrounding and forming compartment 720 about multiple differently-sized electronic components 721, 722, 723, 724, etc., to be cooled. The vapor condenser, with the plurality of thermally conductive condenser fins 712 facilitates condensing of fluid vapor rising to the upper region of compartment 720. Housing 702 is mounted, in this example, to a substrate 701, such as a printed circuit board, to which the plurality of electronic components to be cooled, are attached. Attachment mechanisms 705 (e.g., screws) and gasket seals 706 facilitate forming a fluid-tight compartment about the electronic components. A fluid 730, such as a dielectric fluid, only partially fills compartment 720. By way of example, the fluid may fill less than 50% of the compartment. Note that in the example of FIG. 7A, the multiple differently-sized electronic components 721, 722, 723, 724, etc., may be fully immersed, partially immersed, partially non-immersed, or fully non-immersed, within the dielectric fluid. In one implementation, these electronic components may be different types of electronic components, with different configurations. A sealable fill port 703 may be provided within housing 702 to facilitate adding dielectric fluid to the compartment.

In the example of FIG. 7A, the cooling apparatus further includes a condensate redirect structure 740, which in this embodiment, comprises a vapor-permeable, liquid-phobic material 741. In one embodiment, this liquid-phobic material may be formed as a laminate structure and comprise, as illustrated in FIG. 7B, multiple sloped regions 742. These sloped regions angle inwards and downwards from adjoining interfaces 743 between regions towards respective condensate drip openings 744a, 744b, 744c, 744d, 744e, & 744f, which are differently configured in this example. Advantageously, the condensate drip openings within the different regions are configured and/or patterned to facilitate condensate preferentially dripping onto underlying electronic components that are non-immersed within the dielectric fluid 730. By way of example, electronic component 721 may comprise dual in-line memory modules (DIMMs), which are cards upon which memory modules are affixed. These DIMMs are tall, thin elongate structures, and condensate drip openings 744a in condensate drip structure 740 are sized and configured to correlate, at least in part, to the configuration of the underlying electronic component 721 to be cooled. Similarly, condensate drip openings 744b, 744c, 744d, 744e, & 744f are, in one embodiment, sized and configured to provide a desired pattern of condensate drip over the underlying, partially non-immersed electronic component(s) to be cooled.

As noted, the condensate redirect structure facilitates increasing condensate drip over certain regions, or more particularly, certain components of the electronic system. The structure may be fabricated, in one embodiment, with a shaped, porous coolant-impermeable, vapor-permeable sheet material. The sheet material may be shaped into slight cones, which terminate at the condensate drip openings (e.g., holes, slots, etc.) over the taller (or suspended), at least partially non-immersed electronic components to be cooled to allow the condensate dripping from the vapor condenser to preferentially drip over the non-immersed components. Advantageously, substantially all condensate is directed (in this embodiment) where desired by the condensate redirect structure.

The angled shaping of the vapor-permeable redirect surfaces shown in FIGS. 7A & 7B is exaggerated, with only a slight amount of shaping actually required in order for the condensate drops to flow along the condensate redirect structure to the condensate drip openings. The sizes of the different sloped regions helps to control the distribution of the condensate drip fluid, with hotter electronic components requiring a larger collection area so that a larger amount of condensate drip is provided over those electronic components. The use of a porous vapor-permeable sheet material allows the fluid vapor rising from the heated components to flow through the sheet and reach the vapor condenser disposed in the upper region of the compartment, but the sheet impedes the passage of the condensate drops dripping back from the thermally conductive condenser fins. Thus, vapor can generally flow through the entire sheet material of the condensate redirect structure, but the condensed drops can only flow back through the condensate drip openings provided within the material. By way of example the porous material could comprise PTFE, nylon, polycarbonate, polypropylene, etc. Such materials are available as thin, flexible sheets, and the shaping of the sloped regions could be achieved through heat treatment of laminated versions of these films, where the laminate provides the necessary mechanical stiffness, or through suspension of the native film on an appropriately shaped mesh structure, such as a metal mesh.

Also provided, by way of example only, are heaters 725 immersed within dielectric fluid 730 in the cooling apparatus embodiments depicted in FIGS. 7A-9B. In one implementation, heaters 725 may be provided adjacent to, for example, the one or more at least partially non-immersed electronic components within the compartment in order to initiate more quickly vaporization of fluid, and thus, condensate dripping in the region of the non-immersed electronic components. If employed, heaters 725 could be cycled on for a short time upon initiation of operation of the electronic system to start the cooling cycle described herein.

FIGS. 8A-9B depict alternate embodiments of the cooling apparatus described above in connection with FIGS. 7A & 7B. Configuration and operation of these cooling apparatuses is similar to that described above in connection with FIGS. 7A & 7B, unless noted otherwise below.

Cooled electronic system 800 of FIGS. 8A & 8B includes a cooling apparatus comprising a liquid-cooled vapor condenser 810 with one or more channels to facilitate flow of liquid coolant 811 therethrough. Vapor condenser 810 further includes, in this embodiment, different patterns of thermally conductive condenser fins 812, which define one or more vapor-condensing surfaces disposed at least partially in a vapor region of compartment 720 defined by housing 702 partially surrounding and forming compartment 720 about multiple differently-sized electronic components 721, 722, 723, 724, etc., to be cooled. The vapor condenser 810, with the plurality of patterns of thermally conductive condenser fins 812, facilitates condensing of vapor fluid rising to the upper region of compartment 720. In one embodiment, the different patterns of condenser fins 812 comprise different physical configurations and/or numbers of condenser fins, which provide different densities of surface areas that are aligned, in this embodiment, over respective drip pans 842 of a condensate redirect structure 840. If desired, one or more of the fins in one or more selected fin patterns may also be chemically modified to increase condensate drip where needed.

As illustrated in FIGS. 8A & 8B, condensate redirect structure 840 includes, in one embodiment, a mesh structure 841 with a plurality of condensate drip pans 842a, 842b, 842c, 842d, 842e, & 842f, supported by the mesh structure 841. The condensate drip pans 842a-842f (in this example) may be of different sizes and configurations, as illustrated in FIG. 8B. One or more condensate drip openings 844a-844f, respectively, are provided within condensate drip pans 842a-842f. These openings are configured and positioned to provide a desired pattern of condensate drip onto the underlying at least partially non-immersed electronic component to be cooled. The configuration and number of condensate drip openings 844a-844f may correspond, in one embodiment, to the underlying configuration of the at least partially non-immersed electronic component being cooled by the condensate drip. Accumulating of condensate drops within the condensate drip pans 842a-842f is facilitated by the above-noted, different patterns of thermally conductive condenser fins 812 of the vapor condenser.

As a specific example, a first condensate drip pan of the multiple condensate drip pans may be configured to facilitate a first pattern of condensate drip onto a first electronic component (e.g., electronic component 721), and a second condensate drip pan of the multiple condensate drip pans may be configured to facilitate a second pattern of condensate drip onto a second electronic component (e.g., electronic component 722) of the electronic system. In this example the first pattern of condensate drip and the second pattern of condensate drip are different patterns of condensate drip, as can be ascertained from the condensate drip openings depicted in the respective condensate drip pans illustrated in the example of FIG. 8B. The different patterns of thermally conductive condenser fins over the different condensate drip pans further facilitates accumulation of condensate drip within the respective, differently-sized condensate drip pans. In this embodiment, mesh structure 841 advantageously facilitates rise of fluid vapor within the compartment, but any condensate drip outside of the condensate drip pans will drop through mesh structure 841.

In one example, mesh structure 841 may be a metal mesh, and the individual-shaped condensate drip pans may be suspended on the mesh structure. Vaporized coolant flows around the drip pans through the open areas to reach the condenser above. In this embodiment, it is beneficial to increase the density of the condenser fins, or more particularly, to increase the condenser surface area and/or condenser tubing directly over the condensate drip pans so as to increase the amount of condensate drip into the pans. Condensate drops that form elsewhere simply drip back down into the coolant pool, without being directed towards the at least partially non-immersed electronic components to be cooled.

Advantageously, the embodiment of FIGS. 8A & 8B is simpler and potentially less expensive to manufacture than the embodiment described above in connection with FIGS. 7A & 7B, due to the use of standard materials for the mesh and drip pans. However, this embodiment does employ a modified vapor condenser to encourage preferential condensation drops over certain regions of the board, and a certain amount of the condensate drip will not be collected and preferentially dripped back towards the at least partially non-immersed electronic components.

Figure 9A:
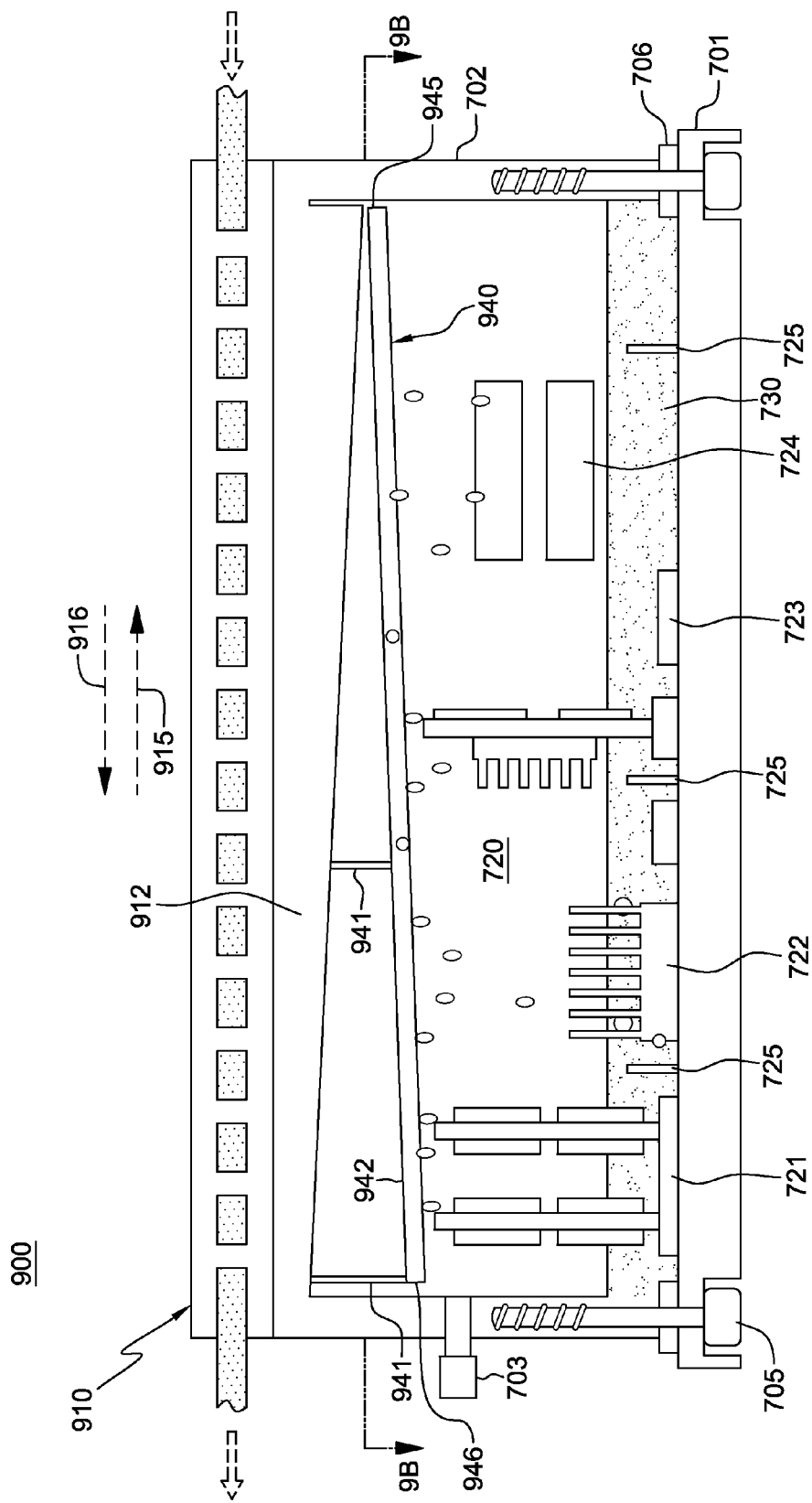
FIG. 9A is a cross-sectional elevational view of another embodiment of a partial immersion-cooled electronic system for, for example, a liquid-cooled electronics rack, in accordance with one or more aspects of the present invention.
Figure 9B:
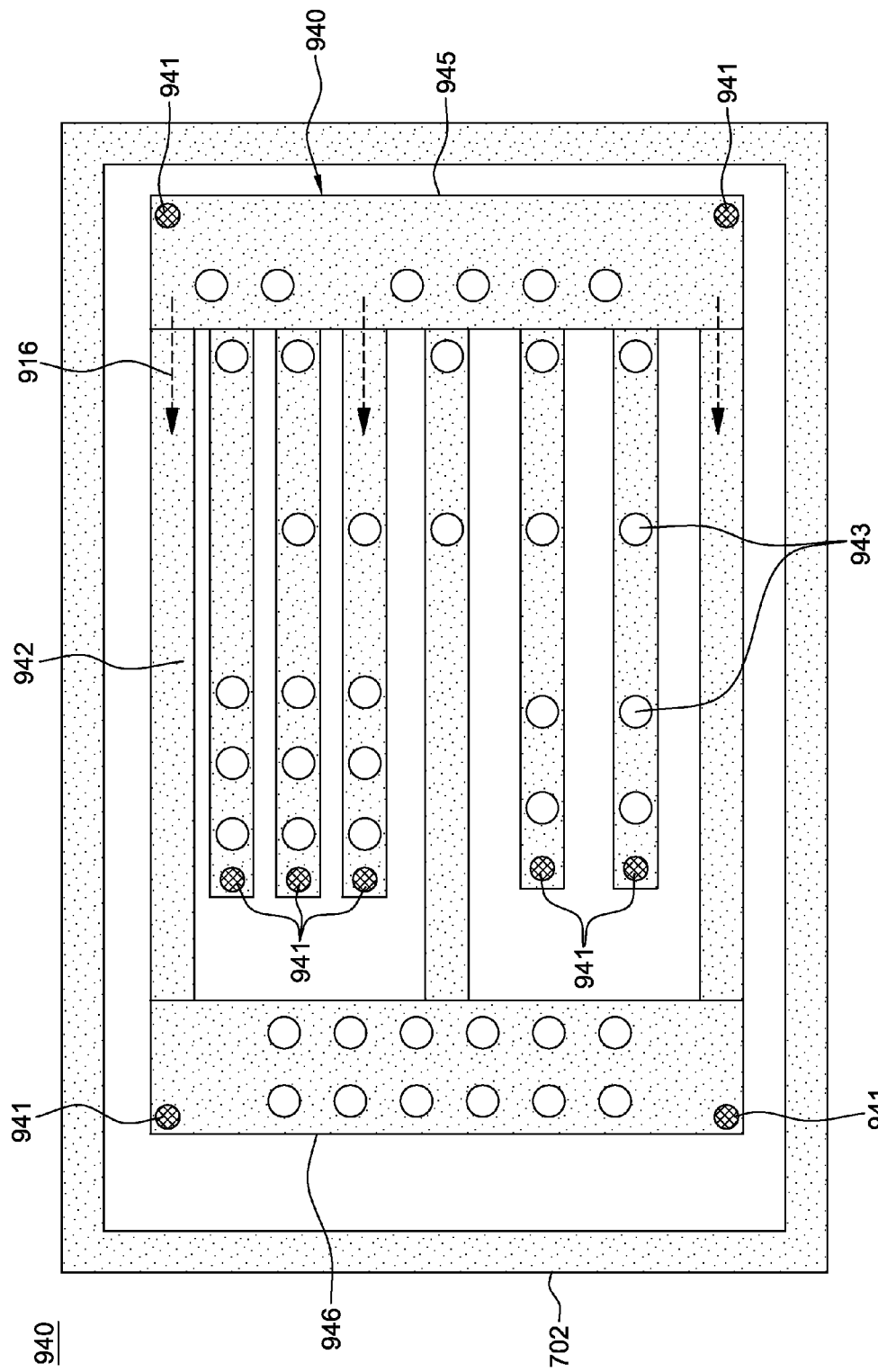
FIG. 9B is a plan view of one embodiment of a condensate redirect structure of the partial immersion-cooled electronic system of FIG. 9A, in accordance with one or more aspects of the present invention.

FIGS. 9A & 9B show another alternate embodiment of a cooled electronic system 900, comprising a cooling apparatus in accordance with one or more aspects of the present invention. In this embodiment, the cooling apparatus includes a liquid-cooled vapor condenser 910 and a condensate redirect structure 940, which in one embodiment, may comprise specially-configured drip pans (such as depicted in FIG. 9B). Condensate redirect structure 940 is suspended via suspension structures 941 so that its upper surface 942 is angled or sloped from a first side 945 to a second side 946 of condensate redirect structure 940. As condensate moves from the first side to the second side of the condensate redirect structure, it drips through openings 943 provided in one or more channels or condensate transport regions 942 of condensate redirect structure 940. As in the above-described cooling apparatus embodiments, condensate drip is preferentially provided over one or more at least partially non-immersed electronic components of the electronic system being partially immersion-cooled. This is achieved by, in one embodiment, configuring condensate redirect structure with a desired pattern of channels or condensate transport regions 942, and condensate drip openings 943 therein, so that the desired patterns of condensate drip are achieved. Note that the embodiment depicted in FIG. 9B is one embodiment only of this concept. Also, note that in this example, different numbers of condensate drip openings may be provided over the differently configured, at least partially non-immersed electronic components to be cooled.

As illustrated in FIG. 9A, condensate collection and preferential drip is further facilitated by providing vapor condenser 910 with one or more sloped, thermally conductive fins 912 that facilitate movement of condensed coolant drops in a first direction 915 for dropping onto condensate redirect structure 940 at first side 945 thereof, wherein the condensate redirect structure 940 is suspended to facilitate movement of the condensate in a second direction 916 along the condensate redirect structure. In the embodiment depicted, the second direction is different from the first direction, and more particularly, is opposite to the first direction.

In the embodiment depicted in FIGS. 9A & 9B, condensate collected at, for example, first side 945, is redirected and dripped back onto the at least partially non-immersed electronic components to be cooled. The condensate redirect structure may include or be fabricated as a drip pan that includes a plurality of connected channels such that condensate drops collected at the first side of the structure flow along the different channels or condensate transport regions, dripping over the at least partially non-immersed electronic components to be cooled as they do. The shape of the channels (or condensate transport regions), as well as the shape and number of condensate drip openings and density, determine how much condensed coolant drips over particular partially non-immersed electronic components. The vapor condenser with the sloped, thermally conductive condenser fin(s) also encourages condensate drops that have condensed elsewhere to flow towards the first side of condensate redirect structure 940 for accumulating and dripping back, as described above. A wettability gradient may also be applied, for example, from the left side (liquid-phobic) to the right side (liquid-philic) to improve the flow of condensed liquid along the condenser fin(s) towards the first side of the condensate redirect structure.

Similar to the embodiment of FIGS. 8A & 8B described above, the solution of FIGS. 9A & 9B is potentially easier to manufacture due to the use of standard materials, but requires the condenser to also be modified. Unlike the embodiment of FIGS. 7A & 7B, not all of the condensate will be preferentially dripped back over the non-immersed electronic components to be cooled. That is, a certain amount of the condensate drops will return directly to the coolant pool without interacting with the non-immersed components.

FIG. 10 depicts one embodiment of a liquid-cooled electronic system 1000 comprising a liquid-cooled electronics rack 1001 with a plurality of partially immersion-cooled electronic systems 1010 disposed, in the illustrated embodiment, horizontally, so as to be stacked within the rack. By way of example, each electronic system 1010 may be a server unit of a rack-mounted plurality of server units. In addition, each electronic system may include multiple electronic components to be cooled, which in one embodiment could comprise multiple different types of electronic components having different heights and/or shapes within the electronic system.

By way of example, the cooling system comprises one or more cooling apparatuses such as described above in connection with FIGS. 7A-9B. In particular, each cooling apparatus 1015 surrounds and forms a compartment about multiple electronic components of the electronic system 1010 to be cooled, and a vapor condenser comprises a liquid-cooled structure with, in one embodiment, a serpentine coolant channel 1017 passing therethrough. Fluid vapor rising to the upper region of the compartment is condensed into condensate drops and falls back onto the condensate redirect structure, such as described above in connection with the embodiments of FIGS. 7A-9B. The cooling apparatus further includes one or more modular cooling units (MCUs) 1020 disposed, by way of example, in a lower portion of electronics rack 1001. Each modular cooling unit 1020 may be similar to the modular cooling unit depicted in FIG. 4, and described above. The modular cooling unit 1020 includes, for example, a liquid-to-liquid heat exchanger 1021 for extracting heat from system coolant flowing through a system coolant loop 1030 of the cooling apparatus, and dissipating heat within a facility coolant loop 1025, comprising a facility coolant supply line and a facility coolant return line. As one example the facility coolant supply and return lines couple modular cooling unit 1020 to a data center facility coolant supply and return (not shown). Modular cooling unit 1020 further includes an appropriately sized reservoir 1022, pump, and optional filter (not shown), for moving liquid coolant under pressure through system coolant loop 1030. In one embodiment, system coolant loop 1030 includes a coolant supply manifold 1031, and a coolant return manifold 1032, which facilitate flow of system coolant (e.g., water) through, for example the liquid-cooled vapor condensers of the cooling apparatuses 1015 disposed to cool the electronic components of the electronic systems 1010.

As a further enhancement, disclosed hereinbelow with reference to FIGS. 11-15C, is a cooling apparatus, wherein partial immersion-cooling is employed in combination with one or more wicking film elements physically contacting one or more selected surface(s) of one or more at least partially non-immersed electronic components of the electronic system to be cooled (such as a server). These one or more non-immersed components may be taller electronic components that are only partially immersed, or may be electronic components suspended within the electronic system such that they are completely non-immersed within the dielectric fluid. The cooling apparatuses and methods disclosed herein facilitate drawing or wicking of the dielectric fluid into close proximity to the at least partially non-immersed components to facilitate cooling thereof via evaporation of the dielectric fluid. Although illustrated in combination with the cooling apparatus of FIG. 7, the cooling apparatus of FIG. 11, with the wicking film elements physically coupled to selected components of the electronic system, may be employed, if desired, without a condensate redirect structure, and/or with different types of vapor condensers.

Generally stated, disclosed herein is an alternate embodiment of a cooling apparatus which includes a housing at least partially surrounding and forming a compartment about multiple components to be cooled, and a fluid (such as a dielectric fluid) disposed within the compartment. A component of the multiple components is at least partially non-immersed within the fluid, and a wicking film element physically contacts a main surface of the component, and is partially immersed within the fluid disposed within the compartment. A coupling element holds the wicking film element in physical contact with the main surface of the component without the coupling element overlying the main surface of the component.

Figure 11:
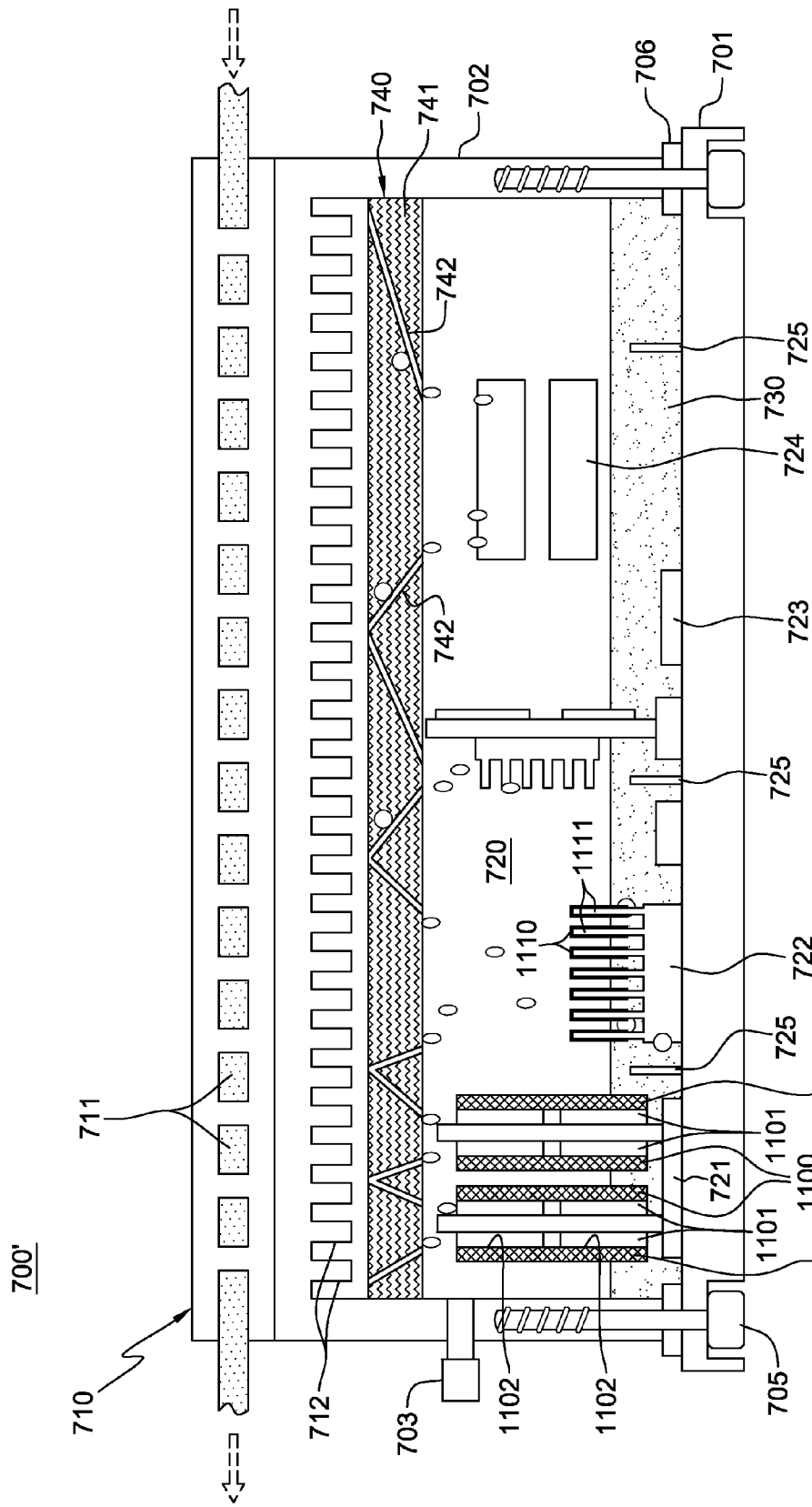
FIG. 11 is a cross-sectional elevational view of another embodiment of a partial immersion-cooled electronic system for, for example, a liquid-cooled electronics rack, in accordance with one or more aspects of the present invention.

One embodiment of such a cooling apparatus is illustrated in FIG. 11. This cooling apparatus 700' comprises a cooling apparatus similar to that described above in connection with FIGS. 7A-7B, with the addition of multiple wicking film elements 1100, 1110 in physical contact with differently configured, at least partially non-immersed components of the electronic system. By way of specific example only, in one embodiment, electronic component 721 may comprise multiple DIMMs, each with multiple chips 1101 disposed on opposite main sides of the respective component board. Respective wicking film elements 1100 overlie the main sides of the component boards, and in particular, the main surfaces 1102 of the chips affixed to the different sides of the component boards. The wicking film elements are (in one embodiment) in physical contact with respective main surfaces 1102 of chips that the elements overlie.

Additionally, in this embodiment, a differently configured component 722 includes a plurality of thermally conductive fins 1111 projecting above the dielectric fluid, and thus, at least partially non-immersed within the dielectric fluid. To facilitate cooling of these thermally conductive fins, the cooling apparatus further includes wicking film elements 1110 that are differently configured from wicking film elements 1100. In accordance with an aspect of the present invention, the wicking film elements for different components may be differently configured and/or fabricated. For example, the wicking film elements 1100 may have a thickness greater than the wicking film elements 1110 in the heterogeneous electronic system example of FIG. 11. Different grades and varieties of porous materials may also be used, depending on the component to be cooled. In this manner, the wicking film elements may be customized for the particular, at least partially non-immersed electronic component to be cooled within the heterogeneous electronic system. As illustrated, each wicking film element 1110 wraps over a respective thermally conductive fin structure 1111 to facilitate evaporative cooling of the fin. As depicted in FIG. 11, wicking film elements 1100 and wicking film elements 1110 are differently configured, and facilitate wicking of dielectric fluid towards the different types of differently configured components 721, 722.

Each wicking film element comprises, in one embodiment, a porous wick structure, such as a porous film. More particularly, one or more of the wicking film elements might be fabricated of porous metal (such as porous silver, porous copper, porous aluminum, or sintered copper), porous glass, porous ceramics (such as porous titania or zirconia), or porous polymer (such as porous polyethersulphone (PES) or nylon). By way of specific example, the wicking films could comprise a film fabricated of copper foam, such as marketed by Metafoam, of Brossard, Quebec, Canada, or porous silver, or porous nylon, both of which are available thorugh Millipore, of Billerica, Mass., U.S.A. The wicking film is fabricated of a high-temperature-tolerant material, and is a porous, dielectric fluid-philic material. By way of specific example, the wicking film elements might have a pore size of microns or smaller to provide the sufficient capillary force to draw the dielectric fluid upwards. Thickness of the film can vary, depending upon the application. In one example, film thickness is less than 5 millimeters, and more particularly, less than or equal to 1 millimeter. Height of the wicking film element can vary, depending upon the height of the component to be cooled, with one to two inches being exemplary. In one embodiment, a portion of the wicking film element, such as 25% of the wicking film element, is disposed within the dielectric fluid in the compartment. Those skilled in the art will understand that the particular configuration, including film thickness, porosity, and pore size, will depend on the type of dielectric fluid employed and the surface tension of the dielectric fluid used. Thus, the wicking film element material, structure, and dielectric fluid to be employed, may be experimentally determined for a particular application.

The porous wick structures wick the dielectric fluid by capillary force, and bring the fluid close to the non-immersed surfaces of the at least partially non-immersed components. The heat of the components causes the fluid within the porous wick structures (or films) to evaporate away, thus assisting in cooling the heated chips or surfaces. The evaporated dielectric vapor egresses from the wicking film, condenses on contact with the condenser surfaces, and drips back to the fluid pool in the lower portion of the enclosure via, by way of example, the condensate redirect structure 740.

FIGS. 12A & 12B depict one embodiment of coupling elements for holding the wicking film element in physical contact with respective main surfaces 1102 of, for example, the chips 1101 mounted to opposite sides of the component board, without the coupling elements overlying the main surfaces of the chips to be cooled. In this embodiment, adhesive lines 1200 are employed as the coupling element. This adhesive, which may (for instance) be a thermal adhesive, attaches to the wicking film elements along the edges of the chips (i.e., at the edges of the main surfaces of the chips). By attaching the adhesive only to the wicking film elements at the edges of the chips, the coupling element (e.g., adhesive, such as epoxy, solder, etc.) does not overlie the heated surfaces physically contacted by the wicking film elements.

Note that although shown in FIGS. 12A & 12B with uniform height, width, and thickness, the wicking film elements 1100 physically couple to the main surfaces of the chips to be cooled may be differently configured, and even have different compositions depending, for example, on the number and types of chips disposed on opposite sides of the component board.

FIGS. 13A & 13B depict another embodiment of a component 1305, such as a DIMM component of an electronic system (not shown), that is partially non-immersed within a fluid disposed within a compartment such as illustrated in FIG. 11. Note that in the example of FIGS. 13A & 13B, the wicking film element 1300 is assumed to be at least partially immersed within the dielectric fluid within the compartment that the component resides. In this implementation, the wicking film element 1300 comprises a material such as described above and is sized to wrap over component 1305 so as to be physically coupled to multiple chips 1301 disposed on opposite sides of the component 1305. Wicking film element 1300 is configured to facilitate wicking of dielectric fluid towards the main surfaces of the chips 1301, and heat dissipated by the chips causes the fluid within the wicking film element to evaporate away, thus assisting cooling of the chips. As in the above examples, each wicking film element may be, in one embodiment, a porous wick structure, such as a porous film made of sintered metal or (for example) a high-temperature polymer, such as porous coolant-philic nylon or porous carbon paper/film. The wicking film element has a length such that when wrapped over component 1305, the ends of wicking film element reside within the dielectric fluid within the compartment.

In this embodiment, the coupling element 1310 comprises a clip, which in one embodiment is a U-shaped, spring clip. Clip 1310 includes a plurality of clip openings 1311, 1312, 1313, which are sized and positioned to align over the respective multiple chips 1301 disposed on opposite sides of component 1305. By configuring and positioning clip openings 1311, 1312, 1313, to overlie the multiple chips 1301, outwardly-egressing dielectric fluid vapor from the film is unimpeded by the clip. The clip 1310 applies a mechanical pressure to wicking film element 1300 wrapped over component 1305, and presses the wicking film element into physical contact with the heated chips (or surfaces) of the component.

In one embodiment, the wicking film element has some mechanical stiffness, for example, being fabricated of a porous metal film or porous polymer. Configuration of the clip to not overlie the underlying chips being cooled, facilitates egressing of dielectric fluid vapor from the wicking film element in the region of the chips, which limits the possibility of vapor building up within the film.

Figures 14A, 14B:
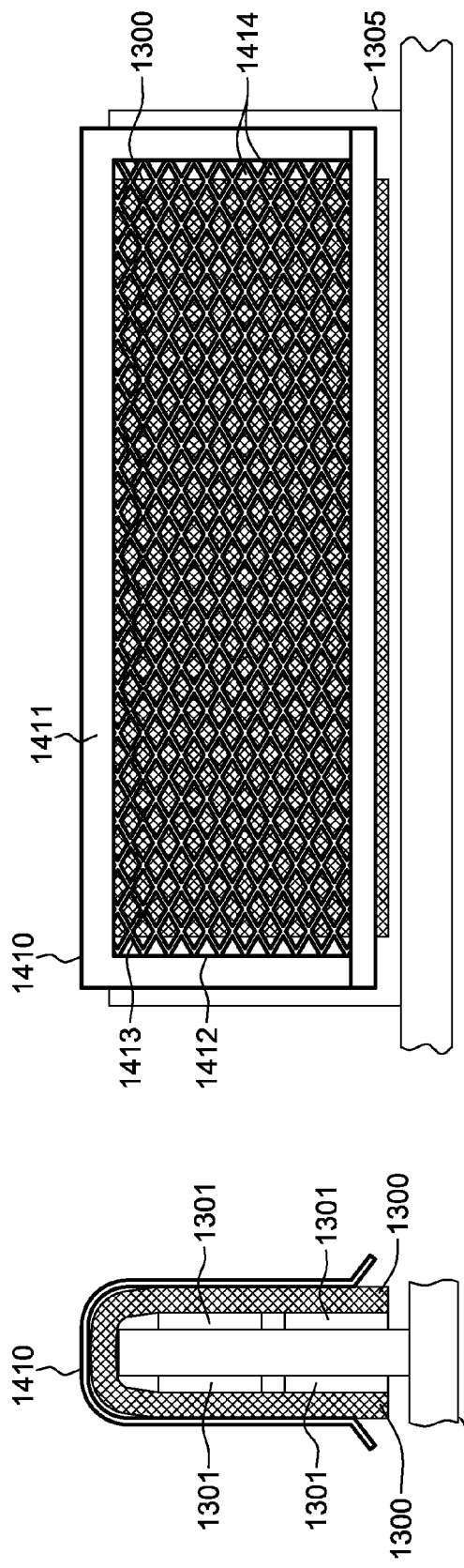
FIG. 14A is an end elevational depiction of another embodiment of a component comprising a component board with multiple chips disposed on opposite sides thereof and a wicking film element wrapped over the component board and chips, and held in place via another embodiment of a coupling element, in accordance with one or more aspects of the present invention.
FIG. 14B is a side elevational view of the structure of FIG. 14A, in accordance with one or more aspects of the present invention.

FIGS. 14A & 14B depict another embodiment of a coupling element 1410 for physically coupling wicking film element 1300 to, for example, multiple chips 1301 on opposite sides of component 1305 of an electronic system, for example, such as depicted in FIG. 11. In this embodiment, coupling element 1410 comprises a clip, such as a U-shaped, spring clip, which is sized and configured to securely couple in physical contact wicking film element 1300 to the heated surfaces of component 1305, such as the main surfaces of chips 1301 disposed on the opposite sides of the component. In this configuration, coupling element 1410 comprises an outer frame 1411 with large first and second clip openings 1412 at opposite main sides of the component 1305. A screen 1413 resides within the first and second clip openings 1412 at the opposite main sides of the component. These screens facilitate securing the wicking film element 1300 in physical contact with the surfaces to be evaporatively cooled by wicking of the dielectric fluid into close proximity to the surfaces. Note that in this embodiment, the screens 1413 include relatively large openings 1414 sized to minimize impeding of egressing fluid vapor from the wicking film element, for example, in the evaporation regions over the chips 1301.

FIGS. 15A-15B depict another embodiment of an electronic component 1505 of an electronic system partially immersion-cooled, in accordance with one or more aspects of the present invention. This electronic component could comprise part of an electronic system such as depicted in FIG. 11, and described above. The component 1505 is analogous to that described above in connection with FIGS. 12A-14B, however, the chips 1501 on opposite main sides of component 1505 are assumed in this example to be differently-sized and configured, and may be (for example) different types of chips providing different functions within the electronic system. In this embodiment, the wicking film elements 1500, 1500' for the different sides of component 1505 are differently configured, for example, to accommodate the differently configured chips 1501 disposed on the opposite main sides of the component. By partially encircling and filling the spaces between the edges of the multiple chips 1501, the wicking film elements 1500, 1500' facilitate bringing dielectric fluid into close proximity to all heated surfaces of the component. Note that in one implementation, the wicking film elements 1500, 1500' may be fabricated of a more rigid material, and include recess regions for the respective chips to be evaporatively cooled by the dielectric fluid. In this embodiment, the coupling element 1510 comprises a plurality of U-shaped clips, which as noted in FIG. 15C, are (in one embodiment) sized and configured so as not to overlie the multiple chips 1501 on the opposite sides of the component 1505. By avoiding overlying the chips, the U-shaped clips assist in securely physically coupling the wicking film elements 1500, 1500' to the respective sides of the component, without inhibiting egress of dielectric fluid vapor from the wicking film elements in the region of the underlying chips being cooled.

Advantageously, the porous wicking film elements disclosed herein wick the dielectric fluid from a lower level of the compartment, drawing the dielectric fluid to the heated components and surfaces non-immersed within the dielectric fluid. The wicked fluid evaporates from the wicking film elements to help cool the associated heated components. This process of evaporation causes more fluid to be wicked up the porous film elements, ensuring continued cooling. The use of porous wicking films to draw and then evaporate the immersion-cooling fluid helps to reduce the amount of fluid necessary to fill the enclosure, since the taller components (i.e., non-immersed components) do not have to be immersed to be cooled by the vaporizing coolant. The reduction in dielectric fluid in turn helps to reduce the cost and weight of the cooling solution described. In addition to this advantage, immersion-cooling has several inherent advantages, including improved temperature uniformity across various, different components of an electronic system, lower required flow rate of the secondary fluid through the vapor condenser, and the potential for warm water cooling. This latter advantage improves energy efficiency, and enables the use of economizers.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprise" (and any form of comprise, such as "comprises" and "comprising"), "have" (and any form of have, such as "has" and "having"), "include" (and any form of include, such as "includes" and "including"), and "contain" (and any form contain, such as "contains" and "containing") are open-ended linking verbs. As a result, a method or device that "comprises", "has", "includes" or "contains" one or more steps or elements possesses those one or more steps or elements, but is not limited to possessing only those one or more steps or elements. Likewise, a step of a method or an element of a device that "comprises", "has", "includes" or "contains" one or more features possesses those one or more features, but is not limited to possessing only those one or more features. Furthermore, a device or structure that is configured in a certain way is configured in at least that way, but may also be configured in ways that are not listed.

The corresponding structures, materials, acts, and equivalents of all means or step plus function elements in the claims below, if any, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to explain the principles of the invention and the practical application, and to enable others of ordinary skill in the art to understand the invention through various embodiments and the various modifications thereto which are dependent on the particular use contemplated.

What is claimed is:

1. A method of facilitating cooling of an electronic system, the method comprising:
   providing a housing at least partially surrounding and forming a compartment about multiple electronic components of the electronic system;
   providing a fluid filling a lower portion of the compartment, wherein an electronic component of the multiple components is at least partially non-immersed within the fluid;
   providing a wicking film element physically coupled to a main surface of the electronic component and partially immersed within the fluid disposed within the lower portion of the compartment; and securing, via a coupling element, the wicking film element in physical contact with the main surface of the component without the coupling element overlying the main surface of the component, and without blocking egress of fluid vapor from the wicking film element over the main surface of the electronic component.

2. The method of claim 1, wherein the component comprises a chip, and wherein the coupling element resides along an edge of the chip, and secures the wicking film element to the chip along the edge of the chip.

3. The method of claim 1, wherein the wicking film element wraps over at least a portion of the component.

4. The method of claim 3, wherein the component comprises at least one thermally conductive fin extending therefrom and at least partially non-immersed within the fluid disposed in the lower portion of the compartment, and wherein the wicking film element wraps over the at least one thermally conductive tin extending from the component.

5. The method of claim 3, wherein the component comprises a component board with a first side and a second side, the first side and the second side being opposite sides of the component board, and wherein at least one chip resides on the first side of the component hoard and at least one chip resides on the second side of the component board, and wherein the wicking film element wraps over the component board and physically contacts the at least one chip on the first side of the board and the at least one chip on the second side of the board.

6. The method of claim 5, wherein the coupling element comprises at least one clip extending over the component board and holding the wicking film element in physical contact with the at least one chip on the first side of the component board and in physical contact with the at least one chip on the second side of the component board without overlying the at least one chip on the first side of the component board or the at least one chip on the second side of the board.

7. The method of claim 6, wherein the component board comprises multiple chips on the first side thereof and multiple chips on the second side thereof, and wherein the at least one clip is configured with at least one first clip opening over the multiple chips on the first side of the component board and at least one second clip opening over the multiple chips on the second side of the component board, the at least one first clip opening over the first side of the component board and the at least one second clip opening over the second side of the component board respectively facilitating egress of evaporated fluid from the wicking film element in regions thereof overlying the multiple chips on the first side of the component board and the multiple chips on the second side of the component board.

8. The method of claim 1, wherein the electronic component comprises a first electronic component, and wherein a second electronic component of the multiple electronic components is at least partially non-immersed within the fluid, the first electronic component and the second electronic component being differently configured electronic components, and wherein the wicking film element comprises a first wicking film element coupled to the first electronic component, and the cooling apparatus further comprises a second wicking film element coupled to the second electronic component, the first and second wicking film elements being partially immersed within the fluid disposed within the lower portion of the compartment, and wherein the first wicking film element and the second wicking film element are differently configured, and facilitate wicking of fluid towards the differently configured first electronic component and second electronic component.

9. The method of claim 8, wherein the first wicking film element wraps over the first electronic component covering at least a portion of a first side and a second side of the first electronic component, and wherein the first side and second side are opposite main sides of the first electronic component.

\* \* \* \* \*